(12) United States Patent
Leite Gomes et al.

(10) Patent No.: US 11,953,943 B2
(45) Date of Patent: Apr. 9, 2024

(54) DEVICE WITH FOLDABLE DISPLAY

(71) Applicant: LENOVO (SINGAPORE) PTE. LTD., Singapore (SG)

(72) Inventors: Denis Leite Gomes, Campinas (BR); Carlos Eduardo Dias Duarte, Indaiatuba (BR); Alanderson Salomao Goncalves, Campinas (BR)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/750,325

(22) Filed: May 21, 2022

(65) Prior Publication Data

US 2023/0376075 A1 Nov. 23, 2023

(51) Int. Cl.
G06F 1/16 (2006.01)
H10K 77/10 (2023.01)
H10K 102/00 (2023.01)

(52) U.S. Cl.
CPC .......... *G06F 1/1641* (2013.01); *G06F 1/1681* (2013.01); *H10K 77/111* (2023.02); *H10K 2102/311* (2023.02)

(58) Field of Classification Search
CPC ... G06F 1/1641; G06F 1/1681; H10K 77/111; H10K 2102/311
See application file for complete search history.

(56) References Cited

U.S. PATENT DOCUMENTS

| | | | |
|---|---|---|---|
| 7,782,274 B2 | 8/2010 | Manning | |
| 10,082,832 B1 * | 9/2018 | Wang | G06F 1/1681 |
| 10,180,704 B1 | 1/2019 | Stewart et al. | |
| 10,296,054 B2 | 5/2019 | Holung et al. | |
| 11,442,506 B1 * | 9/2022 | Hsu | G06F 1/1654 |
| 11,714,451 B2 * | 8/2023 | Lee | G06F 1/169 |
| | | | 361/679.01 |
| 2005/0134524 A1 * | 6/2005 | Parker | G06F 3/1438 |
| | | | 345/1.1 |
| 2009/0059496 A1 * | 3/2009 | Lee | G06F 1/165 |
| | | | 361/679.04 |

(Continued)

FOREIGN PATENT DOCUMENTS

| | | | |
|---|---|---|---|
| CN | 113539090 A | 10/2021 | |
| KR | 20110006495 U | * 6/2011 | |
| WO | WO-0169358 A1 | * 9/2001 | F16M 11/12 |

OTHER PUBLICATIONS

Cunningham, K., Applied Materials, Foldable Phones Bend the Limits of Technology, Jul. 2019 https://www.appliedmaterials.com/nanochip/nanochip-fab-solutions/july-2019/foldable-phones-bend-the-limits-of-technology (6 pages).

*Primary Examiner* — Rockshana D Chowdhury
(74) *Attorney, Agent, or Firm* — Brian J. Pangrle

(57) ABSTRACT

A device can include a processor; memory accessible to the processor; a base housing; a display housing that includes a front side, a back side and a display panel on the front side that spans an intermediate portion and wing portions of the display housing, where the wing portions fold over the front side of the intermediate portion, where the wing portions open to form a continuous front facing viewable display, and where the wing portions open and fold over the back side of the intermediate portion and meet to form a substantially continuous back facing viewable display; and a hinge assembly that couples the display housing to the base housing.

20 Claims, 17 Drawing Sheets

(56) References Cited

U.S. PATENT DOCUMENTS

| | | |
|---|---|---|
| 2010/0064244 A1 | 3/2010 | Kilpatrick, II et al. |
| 2010/0283734 A1* | 11/2010 | Hallbauer ............. G06F 1/1641 |
| | | 345/173 |
| 2011/0006495 A1* | 1/2011 | Chaudeurge .......... B60B 33/025 |
| | | 280/39 |
| 2011/0298690 A1* | 12/2011 | Reilly .................. G06F 1/1649 |
| | | 345/1.1 |
| 2017/0227993 A1 | 8/2017 | Holung et al. |
| 2019/0011955 A1 | 1/2019 | Stewart et al. |
| 2019/0339740 A1* | 11/2019 | Park ................... G06F 3/04886 |
| 2021/0034107 A1* | 2/2021 | Therien .................... G06F 3/14 |
| 2022/0163999 A1 | 5/2022 | Perelli et al. |

* cited by examiner

DEVICE WITH FOLDABLE DISPLAY

TECHNICAL FIELD

Subject matter disclosed herein generally relates to display devices including computers and computer displays.

BACKGROUND

A device can include a housing with a display or housings coupled via one or more hinge assemblies where one or more of the housings can include a display.

SUMMARY

A device can include a processor; memory accessible to the processor; a base housing; a display housing that includes a front side, a back side and a display panel on the front side that spans an intermediate portion and wing portions of the display housing, where the wing portions fold over the front side of the intermediate portion, where the wing portions open to form a continuous front facing viewable display, and where the wing portions open and fold over the back side of the intermediate portion and meet to form a substantially continuous back facing viewable display; and a hinge assembly that couples the display housing to the base housing. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
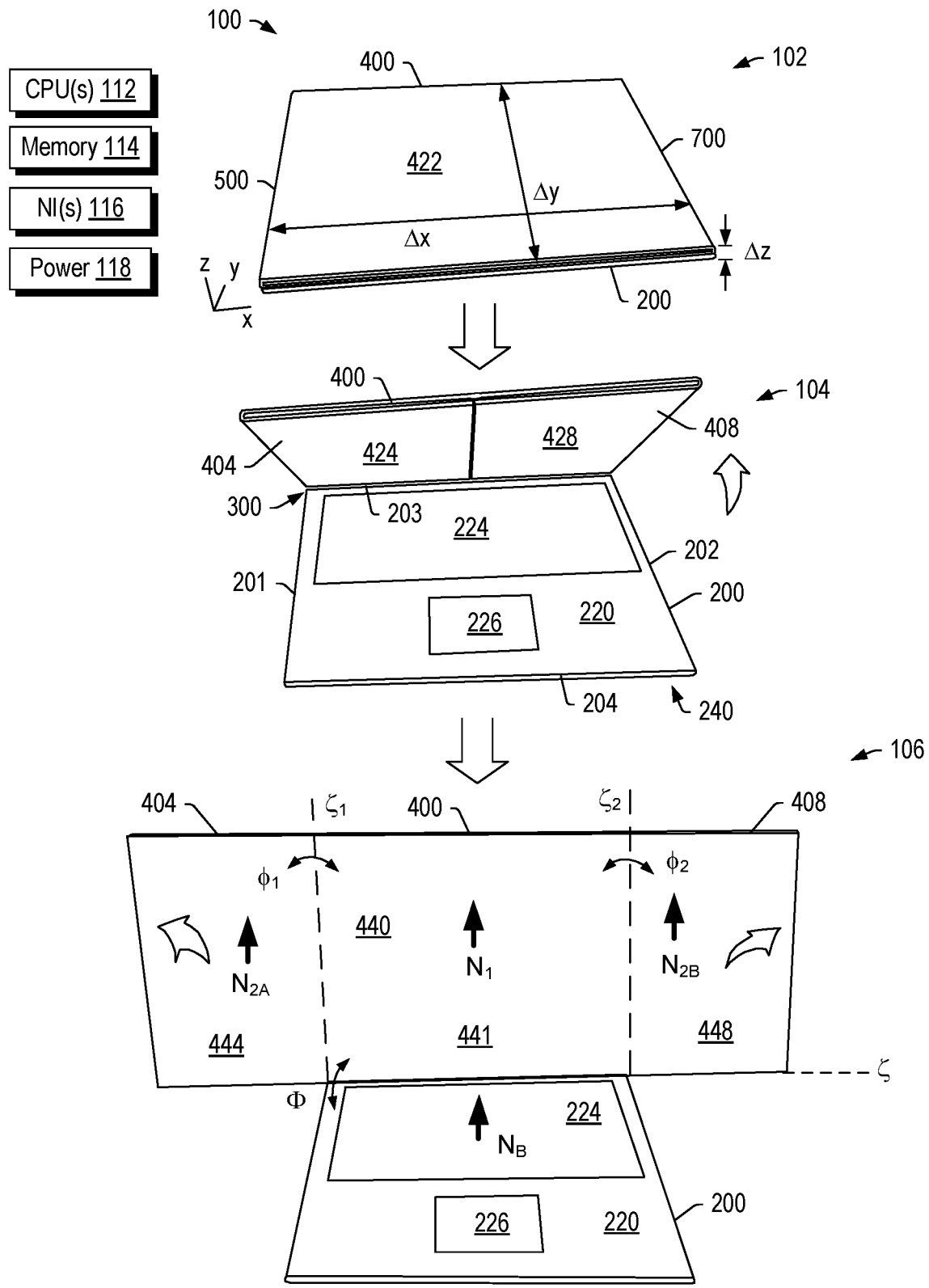
FIG. 1 is a series of views of an example of a device.

FIG. 1 shows an example of a device 100 (e.g., an apparatus) that can include a processor 112 (e.g., one or more processors, one or more cores, etc.), memory 114 accessible to the processor 112, a foldable display housing 400, a base housing 200, and a hinge assembly 300 that couples the foldable display housing 400 to the base housing 200. A US patent application, having Ser. No. 17/100,838, filed 21 Nov. 2020, entitled Folding Device, is incorporated by reference herein in its entirety.

In the example of FIG. 1, the foldable display housing 400 includes wings 404 and 408 that can fold via hinge assemblies 500 and 700. In the example of FIG. 1, the hinge assembly 500 and 700 can include one or more hinge assemblies. For example, consider a hinge assembly with a range from approximately 0 degrees to approximately 360 degrees or multiple hinge assemblies with a range from approximately 0 degrees to approximately 360 degrees.

FIG. 1 shows a closed orientation 102 where a display panel 440 that includes portions 441, 444 and 448 are protected in that they do not contact features of the surface 220 of the base housing 200 such as, for example, depressible keys of a keyboard 224. As shown, the display housing 400 includes a back surface 422 (e.g., a back side), which may be considered to be an outer surface in the closed orientation 102.

In an intermediate orientation 104 shown in FIG. 1, the display housing 400 can be rotated away from the base housing 200 via the hinge assembly 300, which exposes back surfaces 424 and 428 (e.g., back sides) of the wings 404 and 408. As shown, the base housing 200 can include opposing sides 201 and 202 and opposing back and front sides 203 and 204 (e.g., a hinge edge and a front edge). The base housing 200 may include a touch pad 226, for example, disposed between an edge of the keyboard 224 and the front side 204. Further, the base housing 200 can include a bottom surface 240 that is opposite the surface 220. As an example, the bottom surface 240 may include feet or other features to support the device 100 on a surface (e.g., a desktop, a tabletop, a countertop, etc.).

In an open, planar orientation 106 shown in FIG. 1, the wings 404 and 408 of the display housing 400 can be opened via their respective hinge assemblies 500 and 700 such that surfaces of the display portions 441, 444 and 448 of the display panel 440 are substantially planar.

As shown in FIG. 1, the device 100 can be a computing device, a computing system, etc. In the example of FIG. 1, the device 100 is shown along with a Cartesian coordinate system with an x coordinate axis (x-axis), a y coordinate axis (y-axis) and a z coordinate axis (z-axis). In the closed orientation 102, the device 100 can be characterized by a footprint or an area that can be defined by a widthwise dimension $\Delta x$, a depthwise dimension $\Delta y$, and a thickness $\Delta z$. A volume of the device 100, V, can be approximated by multiplying $\Delta x$, $\Delta y$ and $\Delta z$. For example, where $\Delta x=33$ cm, $\Delta y=22.7$ cm, and $\Delta z=1.8$ cm, the volume V is approximately 1,348 cm$^3$.

As shown, the hinge assemblies 500 and 700 can define axes $\zeta_1$ and $\zeta_2$ (e.g., fold axes) about which angles $\phi_1$ and $\phi_2$ of the wings 404 and 408 of the foldable display housing 400 may be measured. As shown, the display portions 441, 444 and 448 of the display panel 440 can be substantially planar where a respective normal (e.g., normal vector) can be defined $N_1$ and $N_{2A}$ and $N_{2B}$. As an example, the display portions 441, 444 and 448 may be referred to as an intermediate portion and wing portions, respectively. As an example, the angles $\phi_1$ and $\phi_2$ may be measured using the normals $N_1$ and $N_{2A}$ and $N_{2B}$. While the orientation 106 is an open planar orientation, the device 100 may be usable with one or more of the wings 404 and 408 closed or with one of the angles $\phi_1$ and $\phi_2$ less than 180 degrees.

In the example of FIG. 1, the open planar orientation 106 shows the normals $N_1$ and $N_{2A}$ and $N_{2B}$ as being in a common direction such that a continuous substantially planar display is provided where the angles $\phi_1$ and $\phi_2$ are each approximately 180 degrees (e.g., +/−5 degrees). As explained, one or more of the angles $\phi_1$ and $\phi_2$ may be less than 180 degrees such that a more "surround" experience is provided for a user. For example, consider the normals $N_{2A}$ and $N_{2B}$ being directed substantially at a user's head and, for example, more particularly at a user's eyes. In such an example, the user may have acceptable vision across the display portions 441, 444 and 448 of the display panel 440. Such an orientation may provide a user with a cockpit experience, which may be beneficial for various types of work tasks, process monitoring tasks, simulation tasks, virtual reality tasks, training tasks, gaming tasks, etc.

In the example of FIG. 1, the intermediate portion 441 of the display panel 440 of the display housing 400 can define an angle $\Phi$ with respect to the base housing 200, which may be measured with respect to an axis $\zeta$. As shown, the top surface 220 of the base housing 200 can be substantially planar where a normal (e.g., normal vector) can be defined $N_B$. As shown, the angle $\Phi$ can be measured using the normals $N_1$ and $N_B$ (e.g., normal vectors).

In the example of FIG. 1, the device 100 can provide a display area that is greater than an area of the top surface 220 of the base housing 200 while being able to provide a footprint or area in a closed orientation that may be approximately equal to the base housing 200, which may facilitate transport, storage, etc.

As an example, hinge assemblies that operatively couple a base housing and foldable display housing may be friction type of hinge assemblies that can maintain a position of the foldable display housings with respect to the base housing. As an example, a foldable display housing may include a stand that can be utilized, for example, to support the device (e.g., for touch-screen touching, etc.). As an example, a stand may extend from a back side of a foldable display housing and may include a stored state and an extended state. As an example, a stand may be a flat panel, a leg, a gusset, etc., which may be pulled out of a back side of a display housing.

Figure 2:
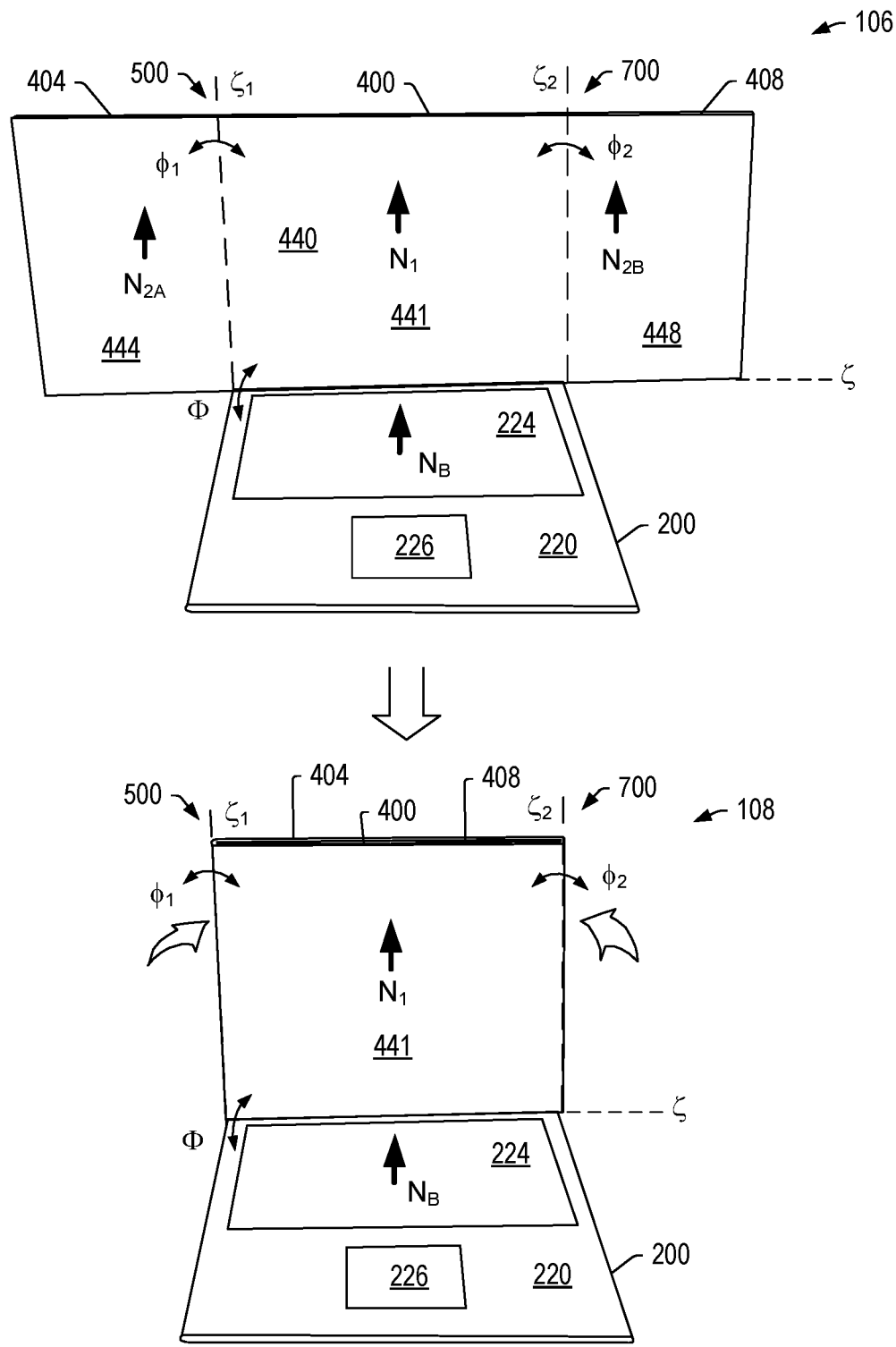
FIG. 2 is a series of views of the example of the device of FIG. 1.

FIG. 2 shows an example of the device 100 in the orientation 106 and transitioned to an orientation 108, which may be an orientation where the wings 404 and 408 of the display housing 400 are each folded approximately 360 degrees with respect to the intermediate portion 441 of the display panel 440 of the display housing 400 such that each of the angles $\phi_1$ and $\phi_2$ may be approximately 360 degrees.

Figure 3:
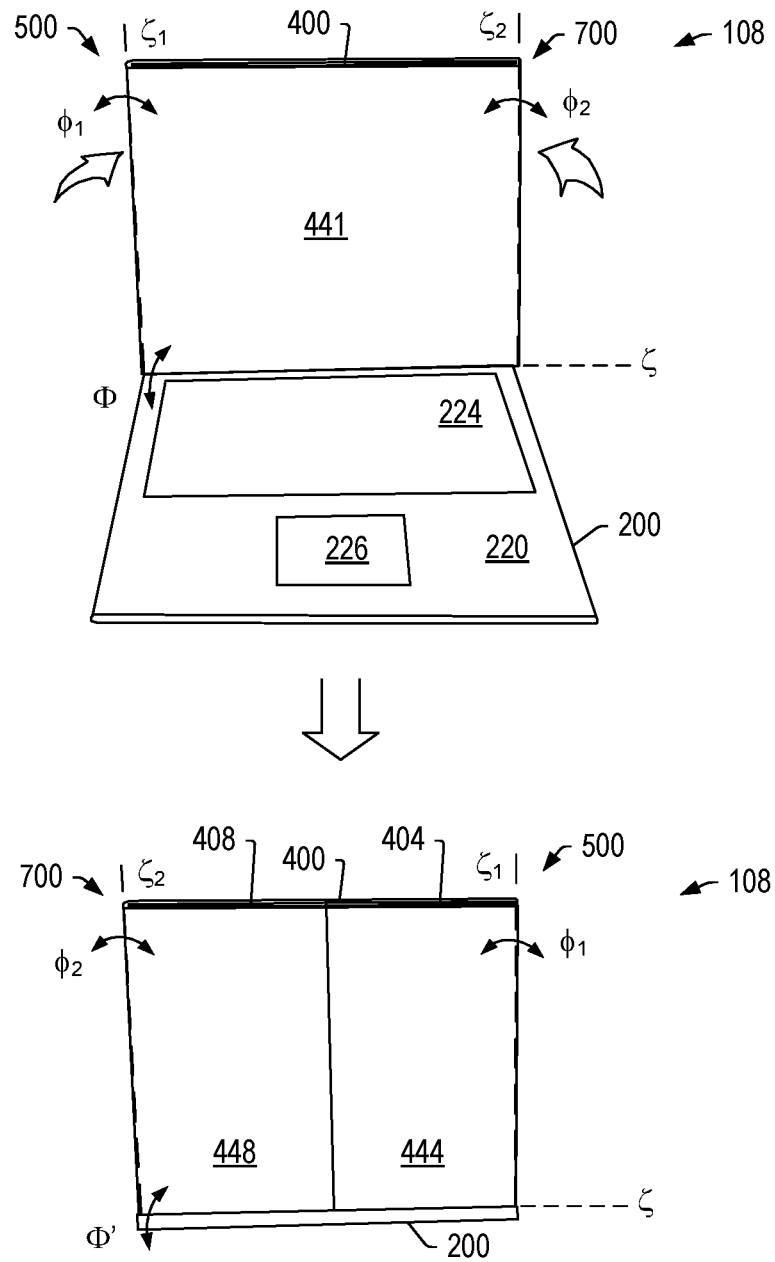
FIG. 3 is a series of views of the example of the device of FIG. 1.

FIG. 3 shows two views of an example of the device 100 in the orientation 108 where one view is a front view where the intermediate portion 441 of the display panel 440 is viewable and where another view is a back view where the wing portions 444 and 448 of the display panel 440 of the wings 404 and 408 of the display housing 400 are viewable. In the example of FIG. 3, the wings 404 and 408 may meet such that the wing portions 444 and 448 appear substantially as a continuous display (e.g., with a joint or juncture, as indicated by a line in the example of FIG. 3).

Figure 4:
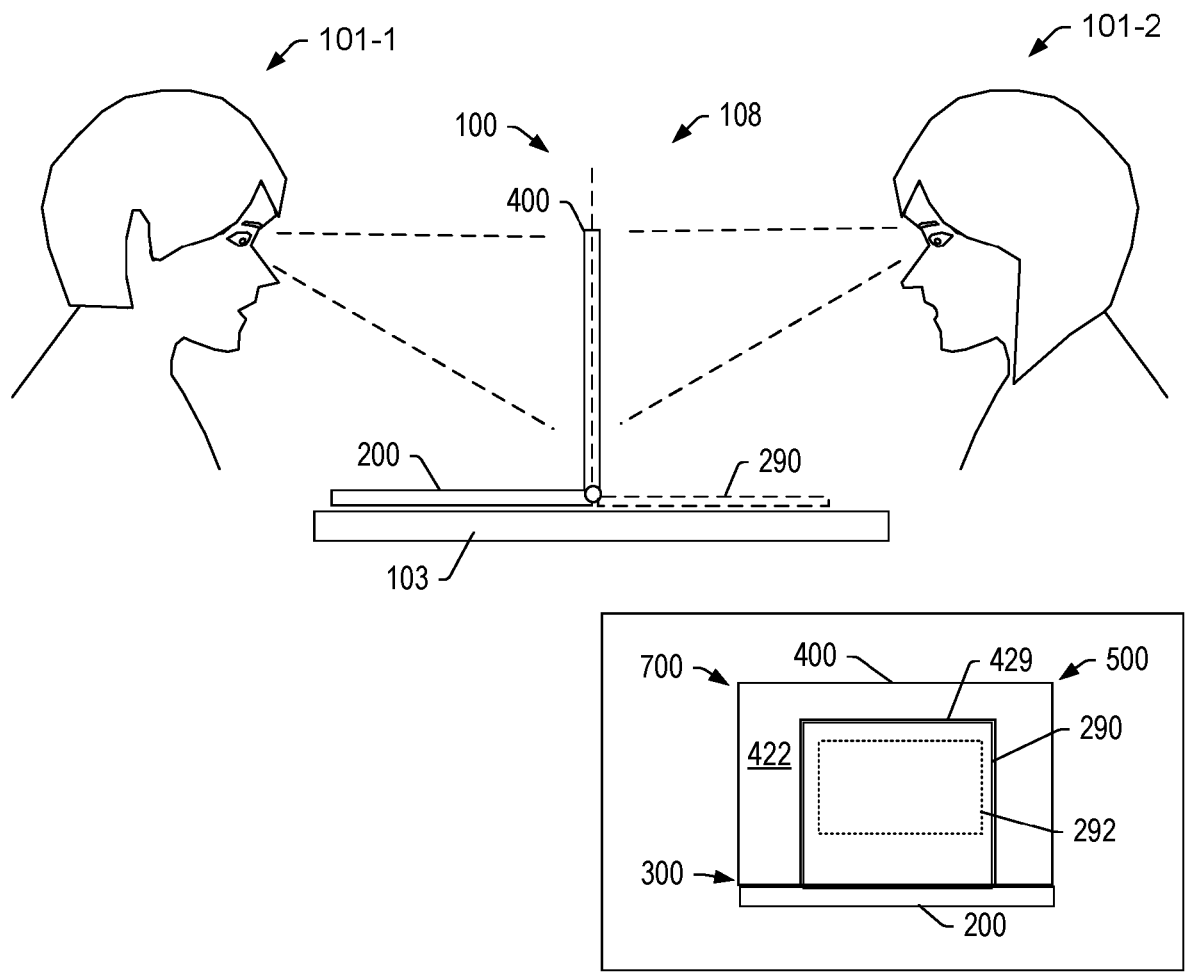
FIG. 4 is a view of an example of the device of FIG. 1.

FIG. 4 shows an example of the device 100 in the orientation 108 with respect to two individuals 101-1 and 101-2 where the device 100 is supported on a desktop 103 at least by the base housing 200.

In the example of FIG. 4, an auxiliary housing 290 may be provided, which can be part of the device 100. For example, consider a fold down keyboard housing that can be folded out of the back side 422 of the display housing 400 or detached from the back side 422 of the display housing 400 prior to folding the wings 404 and 408 to form the substantially continuous back facing viewable display from the wing portions 444 and 448 of the display panel 440. In such an example, the back side 422 can include a recess 429 that may be a rectangular shaped recess with a depth sufficient to receive the auxiliary housing 290; noting that the auxiliary housing 290 may be relatively thin, for example, consider a keyboard housing such as, for example, the SURFACE PRO 3 keyboard housing (Microsoft Corporation, Redmond, Washington), which has a thickness of approximately 5 mm. As an example, the auxiliary housing 290 may have a thickness that is less than 10 mm and that is equal to or greater than 1 mm.

As shown in the example of FIG. 4, the auxiliary housing 290 can include an input surface 292, which may be a touch input surface such as a touchpad and/or a touch-type keyboard. As an example, the auxiliary housing 290 may be positioned with respect to the back side 422 with the input surface 292 facing inwardly or facing outwardly. In a closed clamshell position of the device 100, if the input surface 292 of the auxiliary housing 290 is facing outwardly, it may be available for use in one or more scenarios (e.g., as a wireless keyboard paired with another device such as a TV, another computer, etc.).

As an example, the auxiliary housing 290 may be hinged via one or more hinge assemblies to one or more parts of the device 100 or, for example, such an auxiliary housing may be removable from the recess and separable from the device 100. As an example, the auxiliary housing 290 may attach to the back side 422 of the display housing 400 via one or more magnets. As an example, the auxiliary housing 290 may be wired and/or wireless for communication with circuitry of the device 100. For example, consider a cable and/or wireless circuitry such as BLUETOOTH wireless circuitry. As an example, the device 100 may be operable using two keyboards of two keyboard housings where each of the keyboards provides for interactions with at least a portion of the display panel 440 of the display housing 400. For example, the individual 101-1 can utilize a keyboard of the base housing 200 to interact with at least content rendered to the intermediate portion 441 of the display panel 440 and the individual 101-2 can utilize a keyboard of the auxiliary housing 290 to interact with at least content rendered to the wing portions 444 and 448 of the display panel 440.

As an example, the device 100 may render content to the display portions 441, 444 and 448 where rendering is coordinated for the display portions 444 and 448. For example, the device 100 can consider the display portion 441 (e.g., the intermediate portion) as a first display and the display portions 444 and 448 (e.g., the wing portions) as a second display. In such an example, the first and second displays may be mirrored (e.g., same content) or they may differ. As an example, the display portions 441, 444 and 448 can include touch circuitry such that a user or users may navigate content or otherwise instruct the device 100 via touch input.

As an example, the device 100 may operate effectively as two computing devices where two users may interact with the device 100 in an independent and/or coordinated manner. For example, consider independent operation where the individual 101-1 may utilize a first application and where the individual 101-2 may utilize a second application where interactions can be independent. Or, for example, consider a collaborative application suitable for use by both individuals 101-1 and 101-2 (e.g., a game, a document review application, etc.). As an example, a game may be played using the device 100 as in the orientation 108 where each of the individuals 101-1 and 101-2 cannot see the display portion or portions on an opposite side of the display housing 400.

Figure 5:
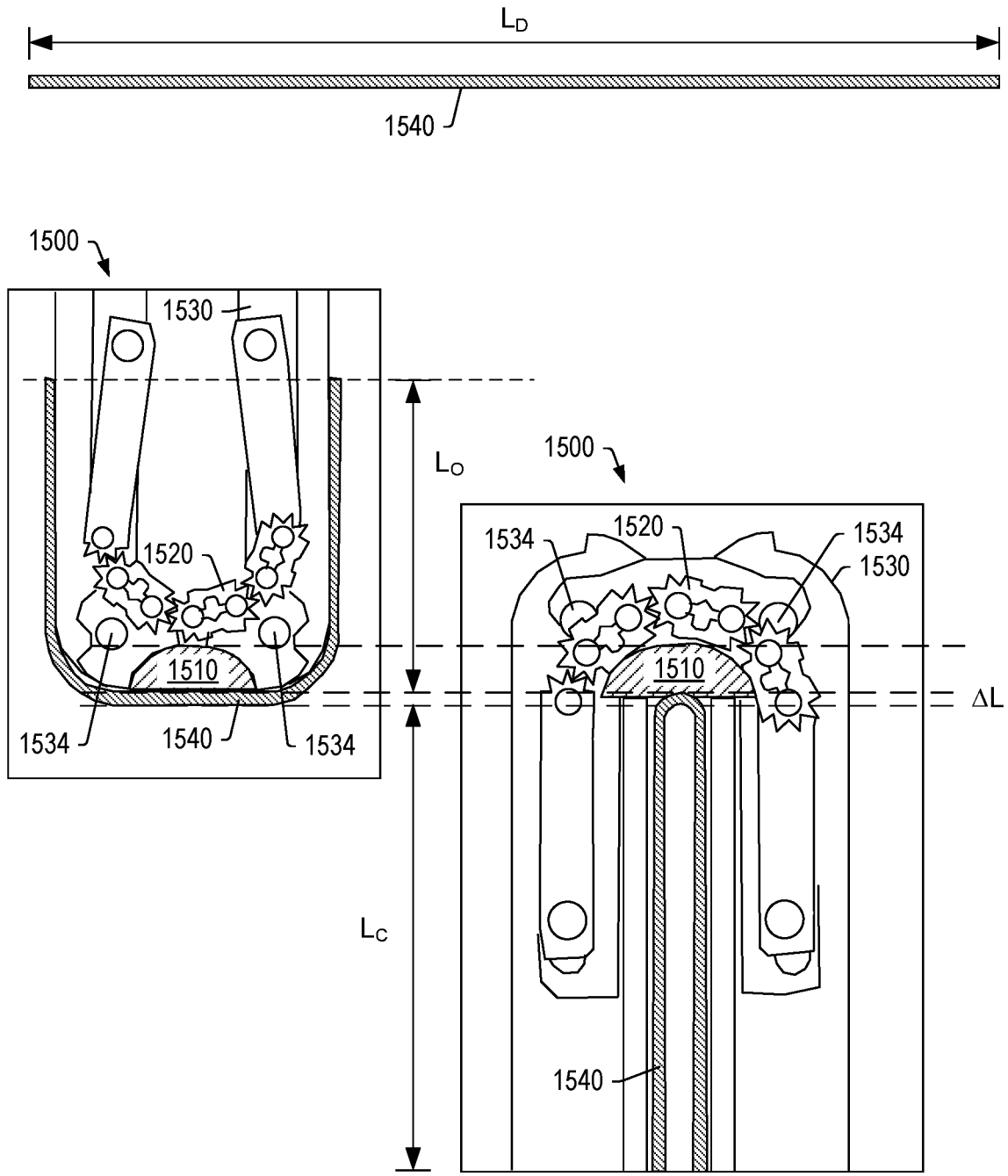
FIG. 5 is a series of views of an example of a display panel and an example of a hinge assembly.

FIG. 5 shows an example of a hinge assembly 1500 in a 360 degree open position (left) and in a 0 degree closed position (right) (see, e.g., CN113539090A, published 22 Oct. 2021, which is incorporated by reference herein in its entirety). As shown, the hinge assembly 1500 can include a support beam 1510 that supports a series of hinge elements 1520 that can include a series of gears and axles where the axles can include positioning axles and transmission axles. The hinge elements 1520 can be operatively coupled to a frame 1530 that can include two drive gears 1534 that are part of a drive mechanism and can support a flexible display panel 1540 that can have a length $L_D$ when flat and straight along with a thickness $\Delta L$. In the example of FIG. 5, in the open position, the amount of the length $L_D$ required for the fold (e.g., bend) is greater than the amount of the length $L_D$ required for the fold (e.g., bend) in the closed position. Thus, a length (see $L_O$) of the flexible display panel 1540 is shorter when in the open position than when in the closed position (see $L_C$). In the example of FIG. 5, the length $L_O$ is approximately 67 percent of $L_C$. In the example of FIG. 5, parallel portions of the flexible display panel 1540 are symmetric when in the open position and parallel portions of the flexible display panel 1540 are symmetric when in the closed position. As shown, symmetry is exhibited by equal length portions of the flexible display panel 1540 extending from a base (flat side) of the support beam 1510 (e.g., equal length portions of length $L_O$ when open and equal portion of length $L_C$ when closed).

The hinge assembly 1500 of FIG. 5 demonstrates that a 360 degree hinge assembly is asymmetric in that the effective radius of curvature differs for 0 degrees (closed) and 360 degrees (open). In the example of FIG. 5, the effective radius of curvature is greater when open 360 degrees than when closed 0 degrees because, at least in part, the frame 1530 must be accommodated. Specifically, the frame 1530 is exterior to the display panel 1540 in the closed position and interior to the display panel 1540 in the open position. As the frame 1530 has a physical thickness that is greater than the thickness $\Delta L$ of the display panel 1540, the hinge assembly 1500 can more tightly fold the display panel 1540 in the closed position than in the open position.

Figure 6:
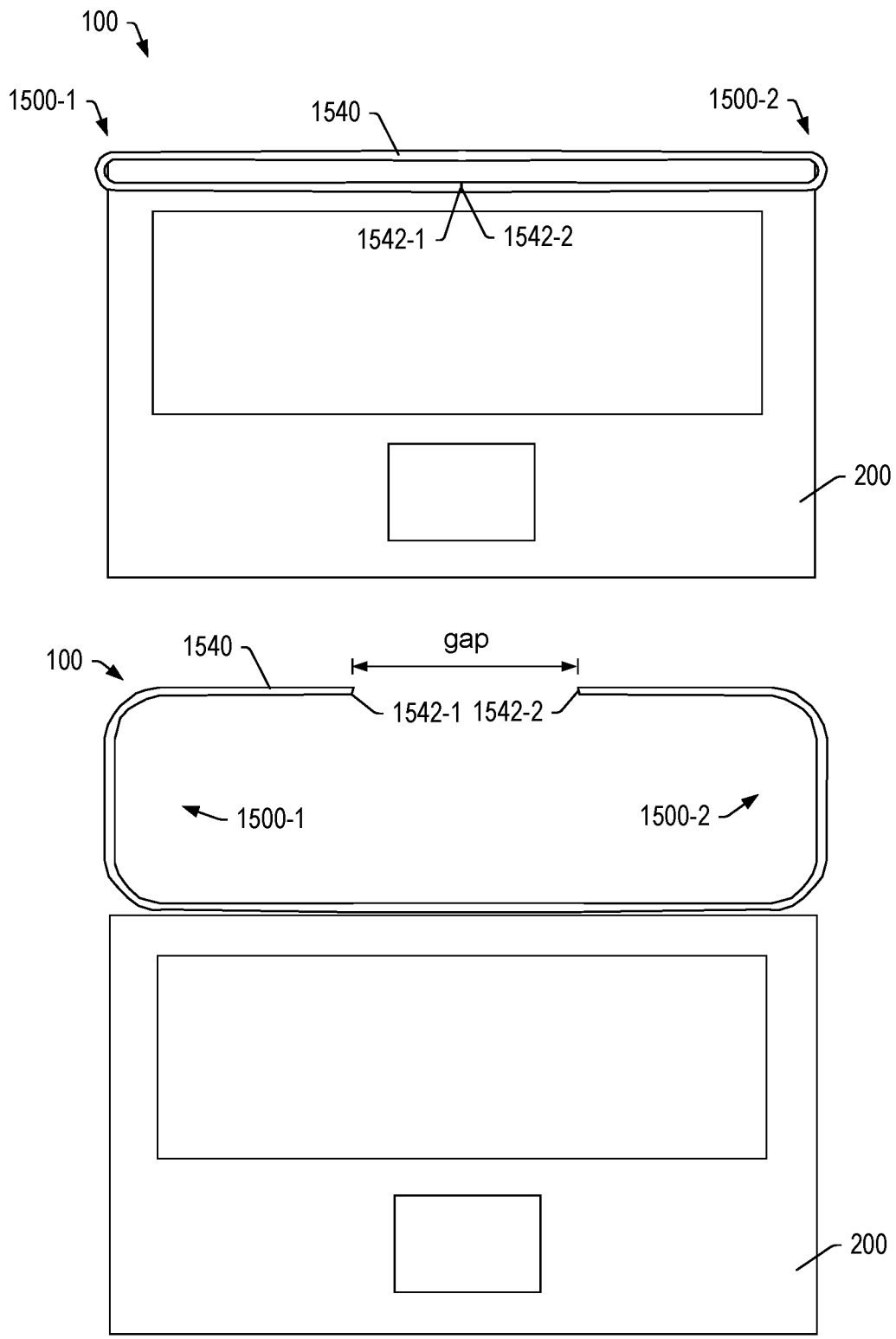
FIG. 6 is a series of views of an example of the device 100 of FIG. 1.

FIG. 6 shows an example of the device 100 with the display panel 1540 and two instances of the hinge assembly 1500, labeled 1500-1 and 1500-2. As shown, if the radius of curvature differs substantially in the closed 0 degree and the opened 360 degree positions, in the opened 360 degree position, ends of the display panel 1540 may not meet such that a substantially continuous display is not formed. Rather, a gap may exist between ends 1542-1 and 1542-2 of the display panel 1540.

Figure 7:
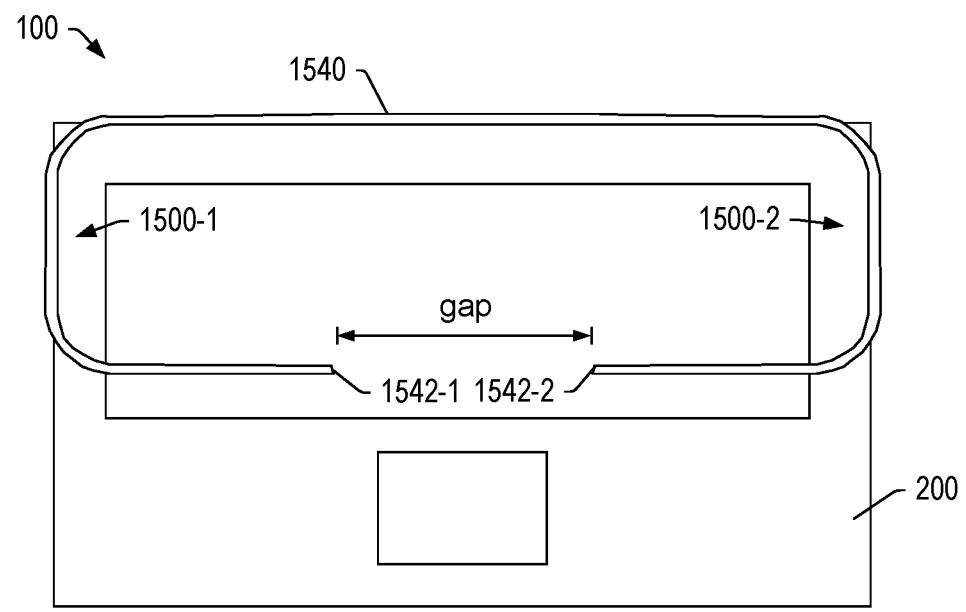
FIG. 7 is a series of views of an example of the device 100 of FIG. 1.
Figure 7:
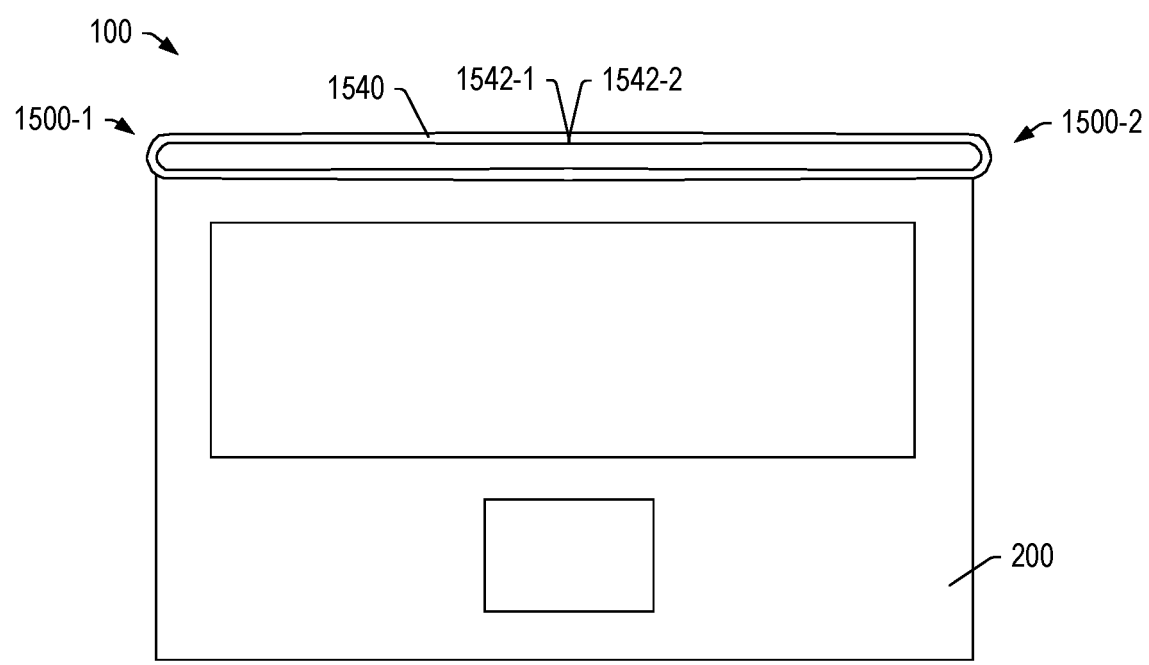

FIG. 7 shows an example of the device 100 with the display panel 1540 and two instances of the hinge assembly 1500, labeled 1500-1 and 1500-2. However, in comparison to the example of FIG. 6, the viewable side of the display panel 1540 is changed. As shown, the radius of curvature differs substantially in the closed 0 degree and the opened 360 degree positions where the closed 0 degree position corresponds to the viewable side of the display panel 1540 as being "closed". In contrast to the example of FIG. 5, in FIG. 6, in the opened 360 degree position, the ends 1542-1 and 1542-2 of the display panel 1540 meet such that a substantially continuous display of the display side of the display panel 1540 is formed. However, in the closed 0 degree position, the ends 1542-1 and 1542-2 of the display panel 1540 do not meet and the device 100 is not capable of being folded into a compact, closed clamshell as the radii of curvature of the hinge assemblies 1500-1 and 1500-2 are quite large. In the example of FIG. 7, a portion of the display panel 1540 may be viewable, for example, in a gap defined by the ends 1542-1 and 1542-2 of the display panel 1540.

While the examples of FIG. 6 and FIG. 7 may be somewhat exaggerated as to the difference between the radius of curvature in the closed 0 degree position and the radius of curvature in the open 360 degree position, such a difference does exist and can make structuring a device with a display panel that can open 360 degrees with ends of a display panel meeting to form a substantially continuous display challenging.

Figure 8:
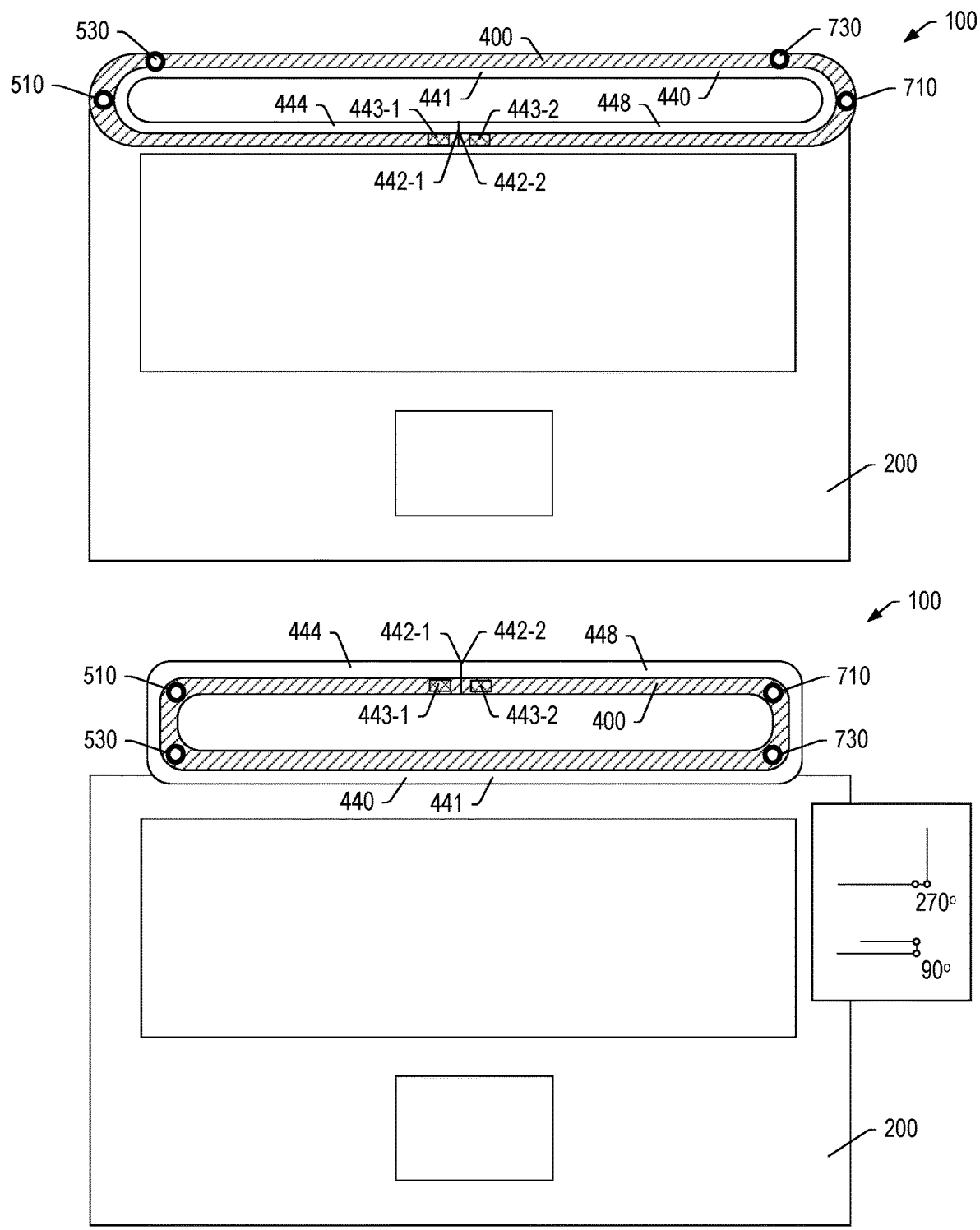
FIG. 8 is a series of views of an example of the device 100 of FIG. 1.

FIG. 8 shows an example of the device 100 with the display housing 400 including four hinge assemblies 510, 530, 710 and 730, where one side includes two hinge assemblies 510 and 530 and the other side includes two hinge assemblies 710 and 730. In such an approach, the device 100 can include a 0 degree closed position with the display panel 440 closed and a 360 degree open position with the display panel 440 open where ends 442-1 and 442-2 of the display panel 440 meet to form a substantially continuous display. In such an example, in the 360 degree open position, the display panel 440 forms a continuous front facing viewable display and a substantially continuous rear facing viewable display (e.g., a viewable display with a joint, etc.).

In the example of FIG. 8, the display housing 400 may include magnetic material 443-1 and 443-2 that can provide a magnetic attraction force. For example, magnetic material such as permanent magnets may be utilized to help maintain the display housing 400 of the device 100 in the closed position (top) and/or in the open position (bottom). As an example, one or more permanent magnets and ferromagnetic material (e.g., iron, etc.) may be used. As shown, the magnetic material 443-1 and 443-2 can be positioned at or proximate to a respective end 442-1 and 442-2 of the display panel 440 or display housing 400. As an example, one or more sensors may be included such as, for example, a Hall effect sensor (e.g., a Hall sensor) such that a signal can be generated that may be indicative of a position of the display housing 400 of the device 100. As an example, a sensor may be positioned at or proximate to one or more of the ends 442-1 and 442-2 of the display housing 400.

In the example of FIG. 8, the hinge assemblies 510 and 530 can provide a sum total range from 0 degrees to 360 degrees and the hinge assemblies 710 and 730 can provide a sum total range from 0 degrees to 360 degrees. For example, the hinge assemblies 510 and 710 may have a range from 0 degrees to 270 degrees while the hinge assemblies 530 and 730 may have a range from 270 degrees to 360 degrees (e.g., 90 degrees).

Figure 9:
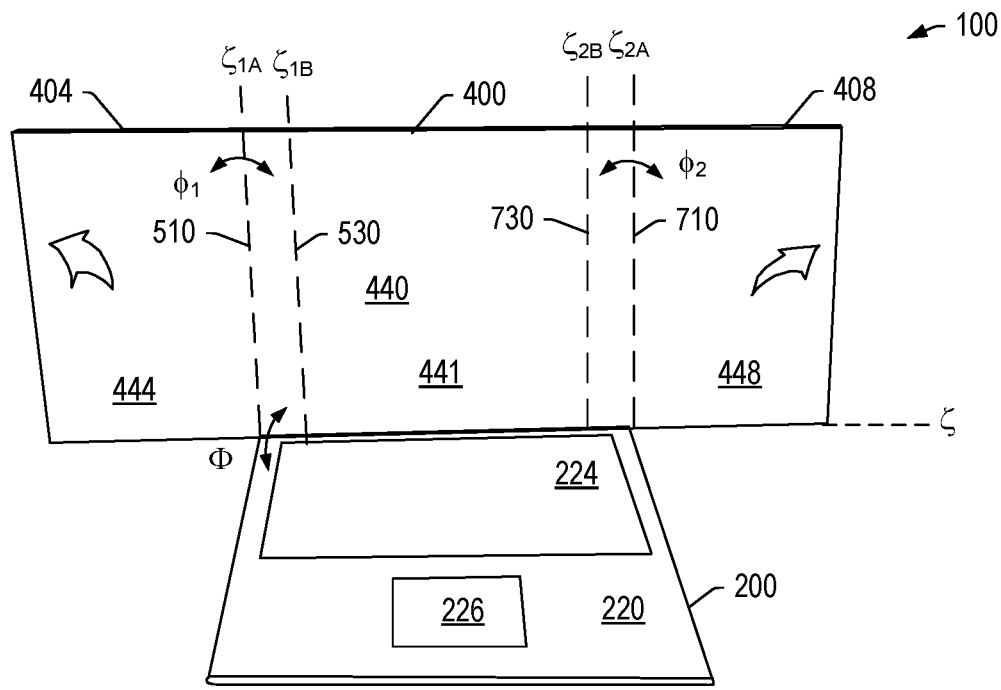
FIG. 9 is a view of an example of the device 100 of FIG. 1.
Figure 9:
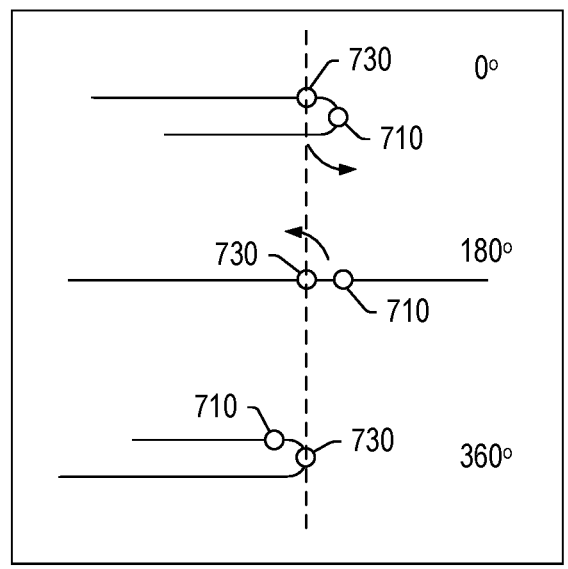

FIG. 9 shows an example of the device 100 of FIG. 8 where axes are labeled for the hinge assemblies 510, 530, 710 and 730 as $\zeta_{1A}$, $\zeta_{1B}$, $\zeta_{2A}$, and $\zeta_{2B}$, respectively. As indicated, the hinge assemblies 530 and 730 are inset from the hinge assemblies 510 and 710. As shown, the display housing 400 of the device 100 can be opened to an approximately 180 degree position via the hinge assemblies 510 and 710 where the wing 404 opens via the hinge assembly 510 and where the wing 408 opens via the hinge assembly 710. As an example, the hinge assemblies 510, 530, 710 and 730 may be 180 degree hinge assemblies. For example, the hinge assemblies 510 and 710 may open the display housing 400 to the flat planar example as shown in FIG. 9 while the hinge assemblies 530 and 730 may further open the display housing 400, for example, to a 360 degree open position where the display portion 441 (e.g., the intermediate portion) forms a front facing viewable display and where the display portions 444 and 448 (e.g., the wing portions) meet to form a substantially continuous back facing viewable display.

In the examples of FIG. 8 and FIG. 9, hinge assemblies may be appropriately spaced to provide for forming a backward facing viewable display in a 360 degree position that is a substantially continuous viewable display where two ends of a flexible display meet.

In the examples of FIG. 8 and FIG. 9, stress and/or strain on a display panel may be reduced compared to a single hinge assembly with a 0 degree to 360 degree range. For example, as hinge axes can be offset, the portion of a display panel that experiences a bend can be offset as well. For example, one portion may experience a range from 0 degrees to 180 degrees and another portion may experience a range from 180 degrees to 0 degrees. In such an approach, a single portion of a display panel is not experiencing a 0 degree to 360 degree bend.

Referring again to the example of FIG. 5, some amount of offset may be achieved using a single hinge assembly. For example, in the closed position of FIG. 5, a portion of the display panel 1540 experiences a fold; whereas, that portion becomes a 180 degree, substantially flat portion in the open position of FIG. 5 while two adjacent portions each bend by 90 degrees (e.g., with radii measurable with respect to the axles 1534).

As an example, a device can include a display housing that utilizes one or more multiple axle hinge assemblies (e.g., two or more axles). As explained, a display housing may utilize a single hinge assembly or multiple hinge assemblies to offset bending portions of a display panel, which may aim to improve integrity of the display panel for multiple cycles of folding (e.g., bending).

Figure 10:
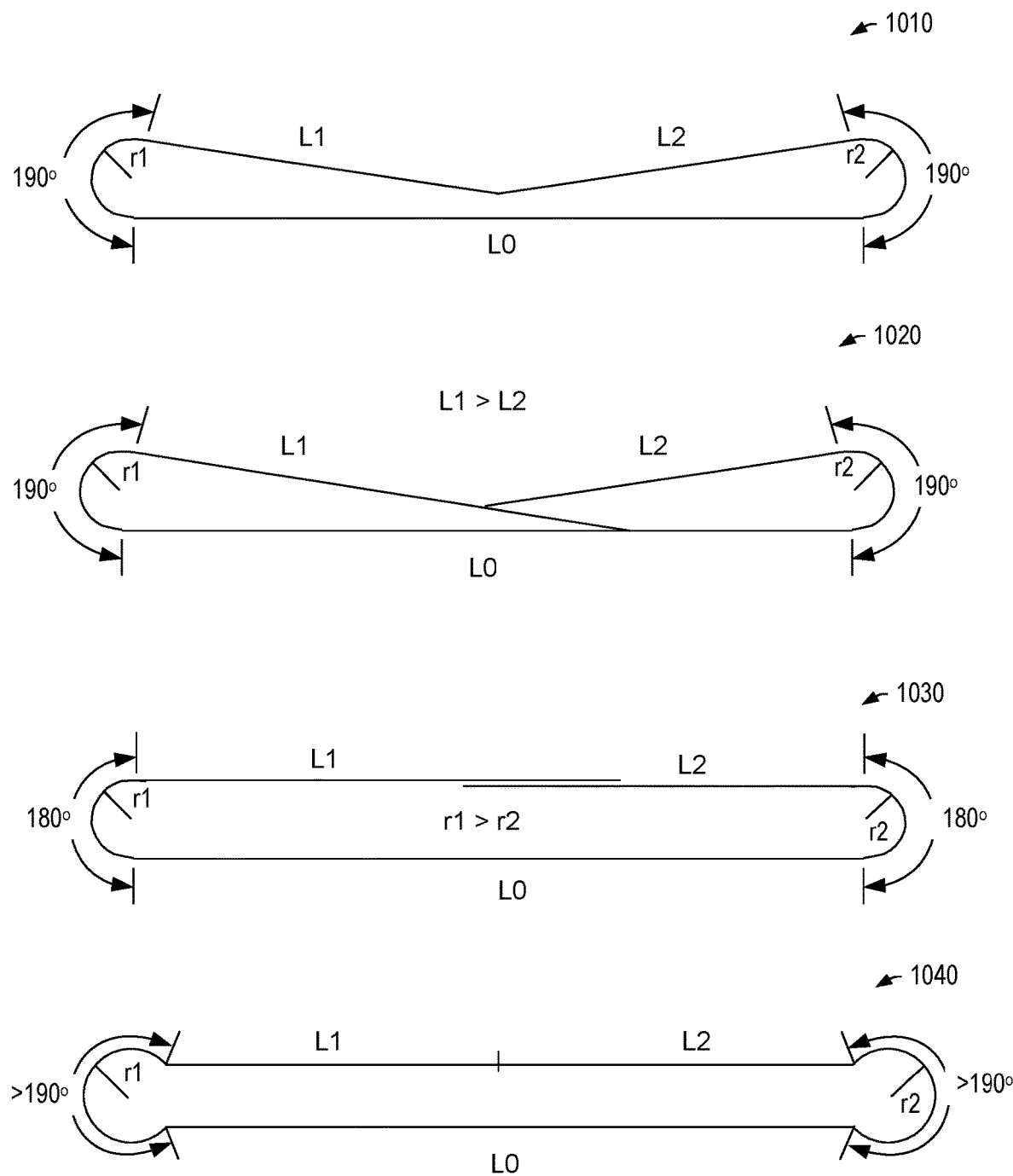
FIG. 10 is a series of approximate schematic views of examples of a display housing.

FIG. 10 shows examples of display housings 1010, 1020, 1030 and 1040 that can include hinge assemblies that can provide for positioning portions of a display panel in a closed orientation, an open front facing orientation and an open back facing orientation where ends of the display panel can meet to form a substantially continuous back facing viewable display along with a front facing continuous viewable display.

As shown in the example display housing 1010 of FIG. 10, in the closed orientation, the wrap angles of hinge assemblies can be greater than 180 degrees, which can provide for sufficient length of display portions that can meet in an open orientation to form a substantially continuous back facing viewable display.

As shown in the example display housing 1020 of FIG. 10, in the closed orientation, the wrap angles of hinge assemblies can be greater than 180 degrees and a first portion of a display panel can be of a length L1 that is greater than a length L2 of a second portion of the display panel, which, in combination, can provide for sufficient length such that the first and second display portions can meet in an open orientation to form a substantially continuous back facing viewable display. The example display housing 1020 may be referred to as an asymmetric display housing where overlap exists between first and second display portions in a closed orientation.

As shown in the example display housing 1030 of FIG. 10, in the closed orientation, the wrap angles of hinge assemblies can be 180 degrees and a first portion of a display panel can be of a length L1 that is greater than 50 percent of a total width of the display housing 1030 in the closed orientation and a second portion of the display panel can be of a length L2 that is greater than 50 percent of a total width of the display housing 1030, which, in combination, can provide for sufficient length such that the first and second display portions can meet in an open orientation to form a substantially continuous back facing viewable display. In the example display housing 1030 overlap exists between first and second display portions in a closed orientation where asymmetry can exist with respect to radii of curvature, for example, the radius r1 can be greater than the radius r2 such that the first display portion of length L1 can fold over the second display portion of length L2 in the closed orientation.

As shown in the example display housing 1040 of FIG. 10, in the closed orientation, the wrap angles of hinge assemblies can be greater than 190 degrees, which can provide for sufficient length of display portions that can meet in an open orientation to form a substantially continuous back facing viewable display. The example display housing 1040 of FIG. 10 can be referred to as a looped display housing as two loops are formed.

In the example display housings 1010, 1020, 1030 and 1040 of FIG. 10, the lengths L1, L2 and wrap angle lengths are sufficient to provide for formation of a substantially continuous back facing viewable display where ends of the first display portion of length L1 and the second display portion of length L2 meet while at least a portion of a display portion of length $L_O$ serves as a front facing viewable display.

In the examples of FIG. 10, a portion of a display housing that supports the display panel can be exterior to the lines shown. For example, a frame of a display housing can be of a thickness that extends outwardly from the lines. In the examples of FIG. 10, the lines can represent a display panel with a length that can be determined by adding the lengths L0, L1, L2 and circumferences that correspond to radii r1 and r2 with the corresponding wrap angles. For example, for the display housing 1010, the length of a display panel can be L0+L1+L2+(190/360)*2π*r1+(190/360)*2π*r2; for the display housing 1020, the length of a display panel can be L0+L1+L2+(190/360)*2π*r1+(190/360)*2π*r2, noting that L1 is greater than L2 such that in an open position ends may not meet along a centerline; for the display housing 1030, the length of a display panel can be L0+L1+L2+π*r1+π*r2, noting that r1 is greater than r2; and, for the display housing 1040, the length of a display panel can be L0+L1+L2+(~220/360)*2π*r1+(~220/360)*2π*r2.

As explained, the length of a display panel can be, accounting for effective radius or radii of curvature and wrap angle or wrap angles, sufficient to provide for meeting of ends of the display panel to form a substantially continuous display from portions of the display panel. In the closed position examples of FIG. 10, a thickness of a display housing can be measured from a viewable surface of a display panel outwardly where upon transitioning wing portions of the display housing to an open position (e.g., 360 degrees open), the thickness of the display housing can be measured from the viewable surface of the display panel inwardly. For example, consider FIG. 5 where an open position and a closed position are shown. Hence, in the open position, the effective radius of curvature for a wing portion is sufficient to accommodate a thickness of a display housing. As an example, a display housing may provide for sliding of a display panel or a portion or portions thereof with respect to a frame. As an example, a display housing may provide for some amount of free motion of a display panel (e.g., for free form shaping, etc.). For example, in the example display housing 1040, a loop or loops may be formed in a space defined by a display housing frame where a portion or portions that form the loop or loops may not be directly in contact with the display housing frame.

In the example display housings 1010, 1020, 1030 and 1040 of FIG. 10, each example may include two or more hinge assemblies. As an example, a display housing can include one or more elastic components. For example, consider an elastomeric component or elastomeric components that can be part of a hinge assembly or hinge assemblies.

As an example, the device 100 may utilize one of the example display housing approaches as explained with respect to FIG. 10 and/or one or more other approaches.

As an example, a hinge assembly may be formed using an elastomeric material (e.g., an elastomer) where, for example, the elastomeric material has a free standing shape (e.g., a relaxed shape in a relaxed state). In such an example, a closed position may be accomplished using magnetic material, for example, in ends of a display housing where the ends can be brought together via magnetic attraction. Similarly, an open position that is 360 degrees open may utilize magnetic attraction. As to a free standing shape, consider a 180 degree open shape where an intermediate portion and wing portions of a display housing can be substantially planar (e.g., in a common plane).

As an example, a display can be an organic light-emitting diode (OLED or organic LED) display. An OLED is a LED in which an emissive electroluminescent layer (or layers) is a film (of films) of organic compound(s) that emits light in response to an electric current. An organic layer can be situated between two electrodes where at least one is transparent.

Figure 11:
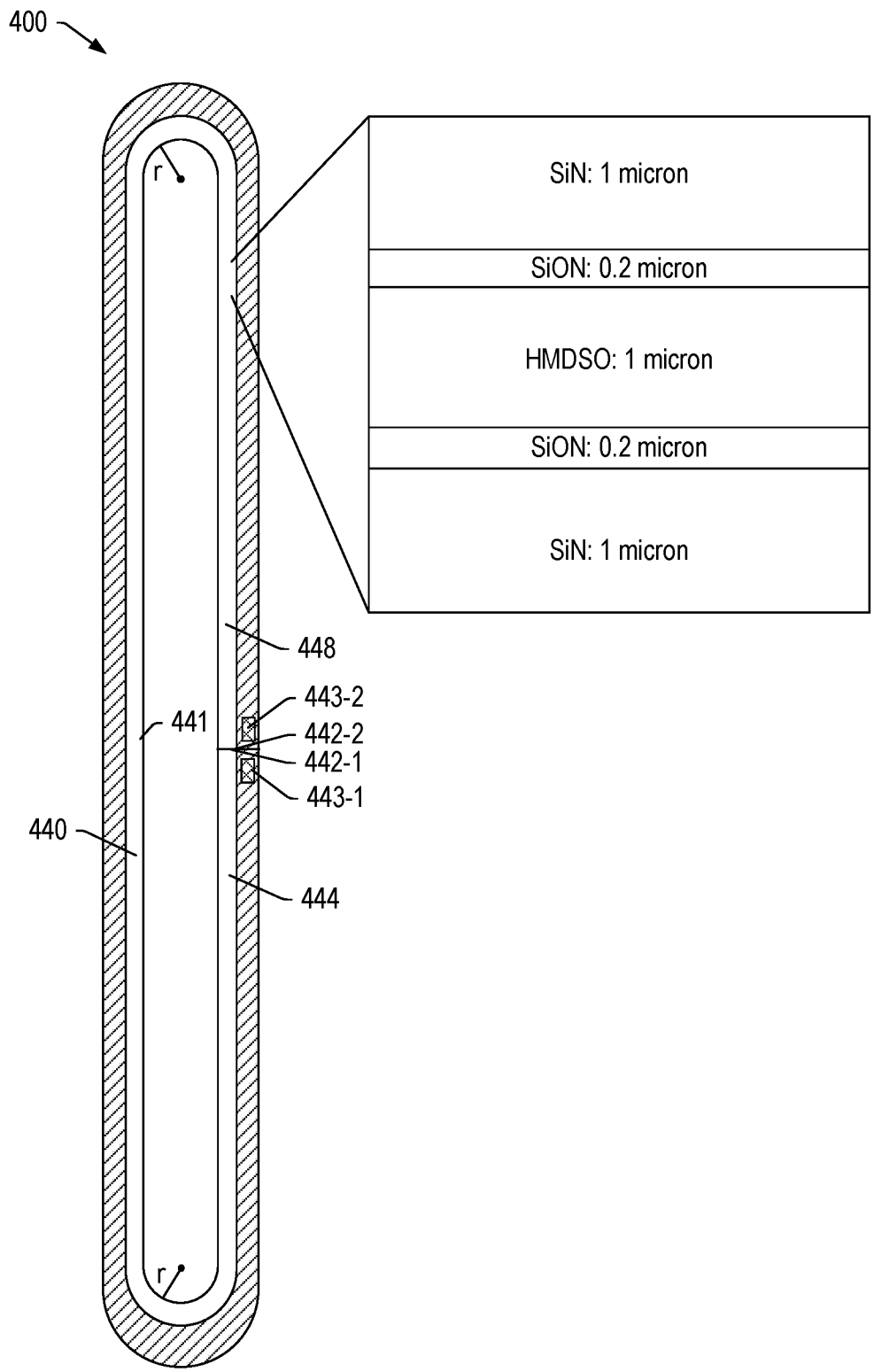
FIG. 11 is an approximate schematic view of an example of a display housing.

FIG. 11 shows an example of a display housing 400 with a flexible display panel 440 with display portions 441, 444 and 448 along with some example layers and approximate thicknesses, which can include one or more SiN layers, one or more SiON layers and a hexamethyldisiloxane (HMDSO) layer. The SiN and/or SiON layers may be insulator layers. An OLED display includes an organic layer or layers that tend to be thin and based on chemically active materials, which may be damaged by exposure to moisture or oxygen. While a rigid OLED may be encapsulated with glass; however, as glass tends to be brittle, one or more other materials can be utilized for a foldable display. For example, consider OCA (optical clear adhesive) and a polarizer; noting that a thin flexible glass may be an option if available. In the example of FIG. 11, one or more other layers may include, for example, a cover window layer, one or more adhesive layers, one or more polarizer layers, one or more retarder layers, one or more filter layers, etc.

As an example, an OLED may utilize a transparent polyimide (PI) film where a hard coating can be applied top and bottom to compensate for the weak hardness. Transparent PI film for a cover window can be of a hardness of about 4H to 6H or more. As an example, an epoxy-siloxane hybrid hard coating transparent PI may be utilized. As an example, a PSA (pressure sensitive adhesive) may be utilized, for example, for pasting layers (e.g., may be used in about 4 or so layers in an OLED); noting that OCA is a type of PSA that can be used to attach a cover window and a polarizer.

For a flexible OLED display, a cover window and polarizer(s) tend to be the thickest and the closest to the exterior environment. A flexible OLED OCA may be about 100 microns to 150 microns thick; though techniques may provide for lowering the thickness to 100 microns or less. As to a polarizer, it acts to reduce reflection of external light, enhance outdoor visibility, and accurately represents black. A polarizer layer may be less than 150 microns in thickness (e.g., consider 100 microns or less).

In the example of FIG. 11, the flexible display panel 440 with display portions 441, 444 and 448 may include one or more folding axes where, for example, a bend radius can be defined by properties of the display, which can be a flexible and foldable OLED display.

As an example, a flexible display may include one or more features of a 13.3 inch (e.g., approximately 34 cm) Quantum Extended Graphics Array (QXGA) foldable 2K (1536×2048 pixel resolution, approximately 3.2 million pixels) OLED, touchscreen with 300 nits (see, e.g., LENOVO THINKPAD X1 Fold, foldable computing device). As an example, a lesser or a higher resolution display may be utilized. As an example, a lesser or a greater nits value display may be utilized. As an example, a flexible display may include touch sensing circuitry or may not. Where touch sensing circuitry is included, a user may be able to interact with the flexible display via touch, for example, where one or more GUIs are renderable to the flexible display. In such an example, a user may readily select content, desired settings, etc.

As explained, a display housing can include an elastomeric material or elastomeric materials. An elastomer can be a rubbery material composed of long chainlike molecules, or polymers, that are capable of recovering their original shape after being stretched (e.g., an elastic polymeric material). In a free standing state or shape, relatively long molecules making up an elastomeric material can be irregularly coiled; however, with application of force, the molecules can straighten to various extents in one or more directions. In such an approach, upon release of the applied force, the molecules can spontaneously return to their original more compact arrangement.

In the example of FIG. 11, the display housing 400 can include elastomeric material that can bend from approximately 0 degrees to approximately 360 degrees. As an example, such elastomeric material may form hinges (e.g., elastomeric hinges). In such an example, the magnetic material 443-1 and 443-2 may be included at or proximate to the ends 442-1 and 442-2 to apply magnetic force that helps the elastomeric material to be held in a folded shape or state. As explained, such an approach may be utilized to help maintain a 0 degree closed position and/or a 360 degree open position of a display housing that includes a display panel with an intermediate portion and wing portions (see, e.g., the display panel 440 with the intermediate portion 441 and the wing portions 444 and 448).

As an example, a display housing can include elastomeric hinge assemblies that can be clamped to frame portions that can include an intermediate frame portion and two wing frame portions adjacent to opposing sides of the intermediate frame portion.

Figure 12:
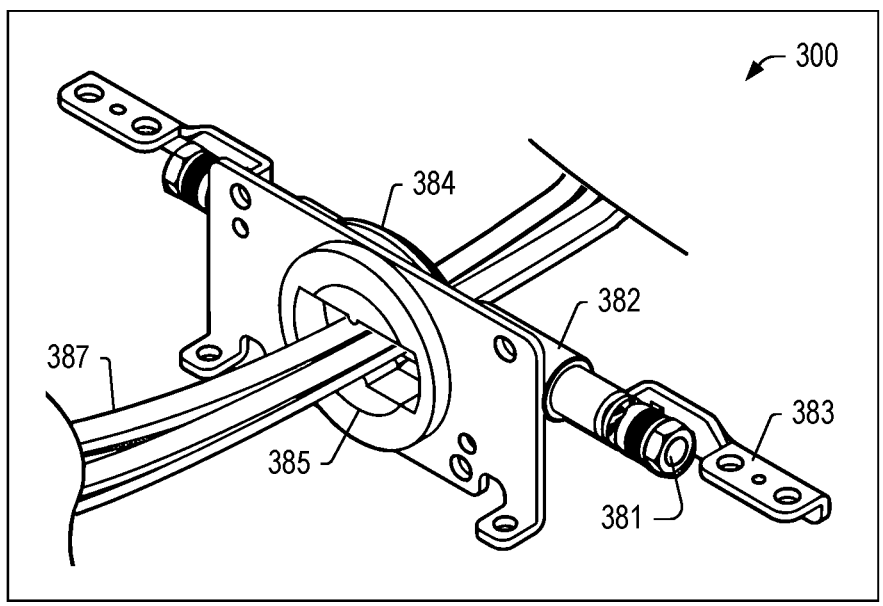
FIG. 12 is a view of an example of a hinge assembly.

FIG. 12 shows an example of the hinge assembly 300. As shown, the hinge assembly 300 includes an axle 381 received at least in part by a barrel 382 where a leaf 383 is coupled to the axle 381. In such an example, various components such as washers, nuts, etc., may be fit to the axle 381 for purposes such as tensioning (e.g., friction), holding components in place, etc. As shown, the hinge assembly 300 also includes a turntable assembly 384 with a passage 385 for one or more wires 387. In such an example, the hinge assembly 380 includes two axes, one associated with the axle 181 and one associated with the turntable assembly 384.

As an example, a device can include one or more hinge assemblies that include one or more features of the hinge assembly 300. For example, in FIG. 1, the one or more hinge assemblies 300 of the device 100 can include a turntable assembly, a barrel or barrels, an axle or axles, etc. As explained, the one or more hinge assemblies 300 can provide for positioning the display housing 400 with respect to the base housing 200.

Figure 13:
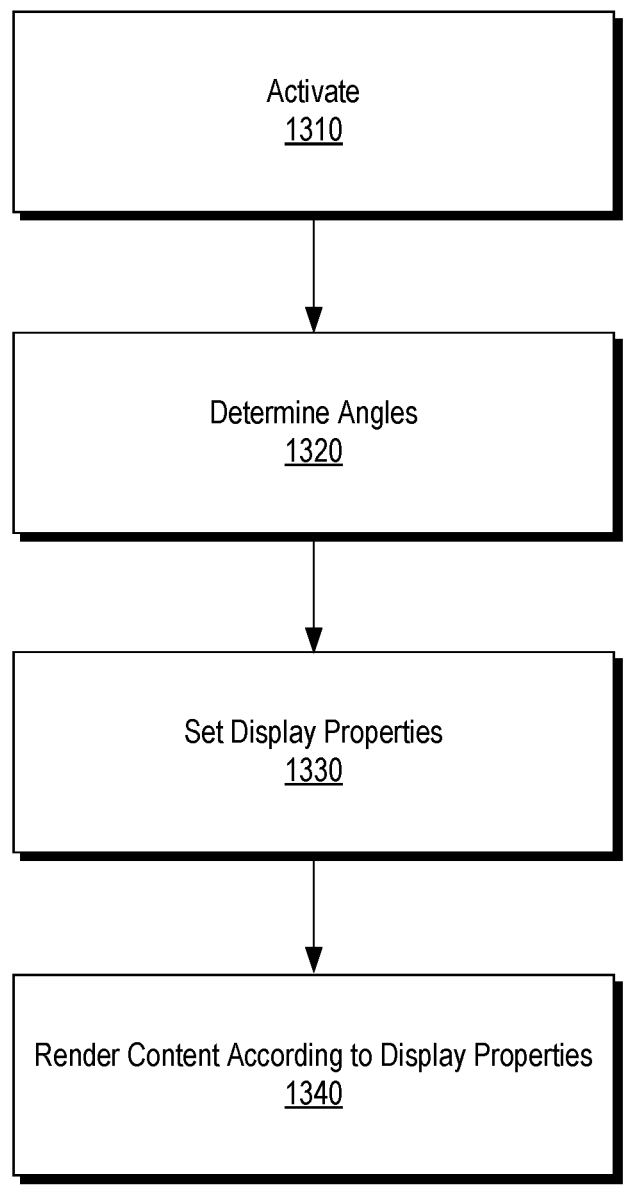
FIG. 13 is a block diagram of an example of a method.

FIG. 13 shows an example of a method 1300 that includes an activation block 1310 for activating a device such as the device 100, a determination block 1320 for determining angles of a foldable display housing of the device, a set block 1330 for setting display properties of the device, and a render block 1340 for rendering content according to the set display properties of the device.

In the example of FIG. 13, the method 1300 can include determining angles of a foldable display housing to determine whether display portions of the foldable display housing are facing a common direction or not. In such an example, one or more circuits may be utilized. For example, consider each display portion of the foldable display housing as include an accelerometer, a gyroscope, a gravity meter, etc., which can provide for independent sensing of movement and/or orientation.

As an example, one or more magnets and/or magnetic field sensors may be utilized, optionally in combination with one or more other sensors. In such an example, consider a Hall type sensor can detect presence and/or magnitude of a magnetic field using the Hall effect where an output voltage of such a sensor can be proportional to the strength of the field. As mentioned, a display housing can include one or more magnets that can help to maintain the display housing in a particular position (e.g., closed or open 360 degrees). In such an example, a magnet or magnets may provide for maintaining position and/or for sensing position of a display housing.

Figure 14:
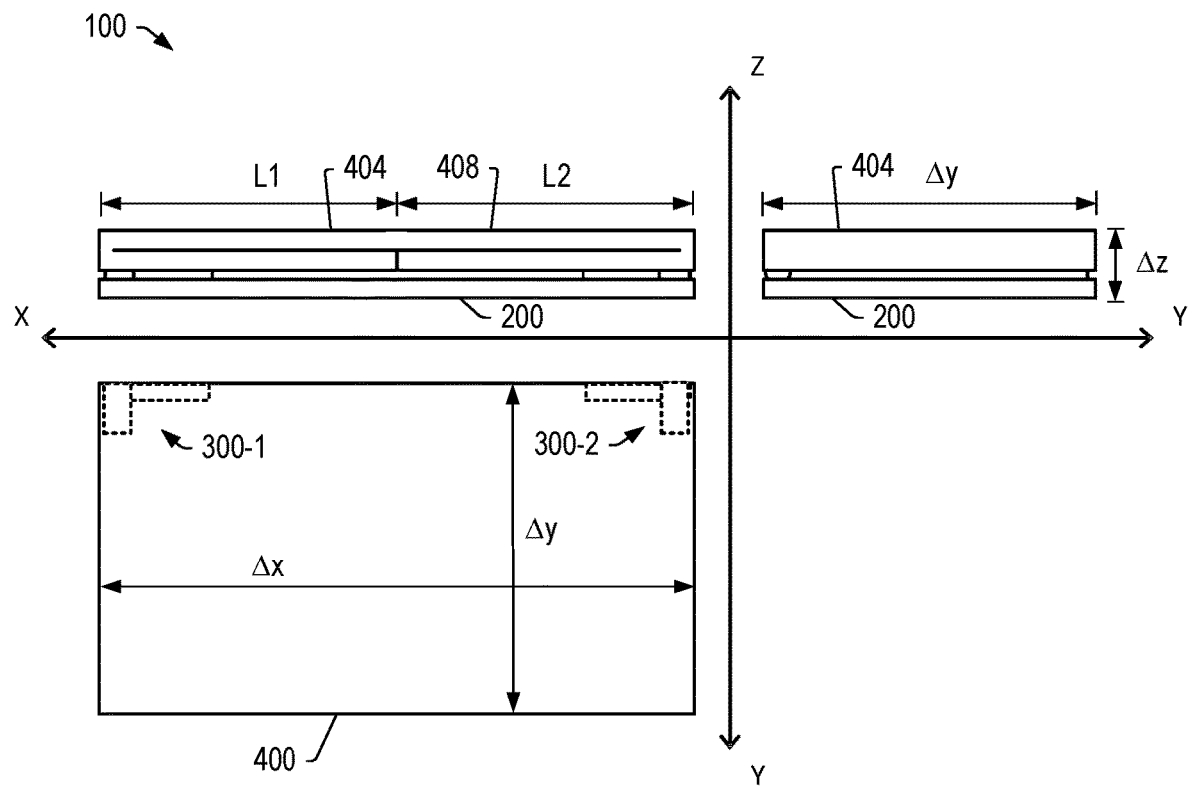
FIG. 14 is a series of diagrams of an example of a device.

FIG. 14 shows various plan views of an example of the device 100 as including the base housing 200 and the display housing 400 with wings 404 and 408 (e.g., and display portions 441, 444 and 448) where the hinge assemblies 300-1 and 300-2 couple the foldable display housing 400 to the base housing 200; noting that a single centered hinge assembly may be utilized (e.g., optionally with a turntable) or one or more arrangements of one or more hinge assemblies may be utilized.

Figure 15:
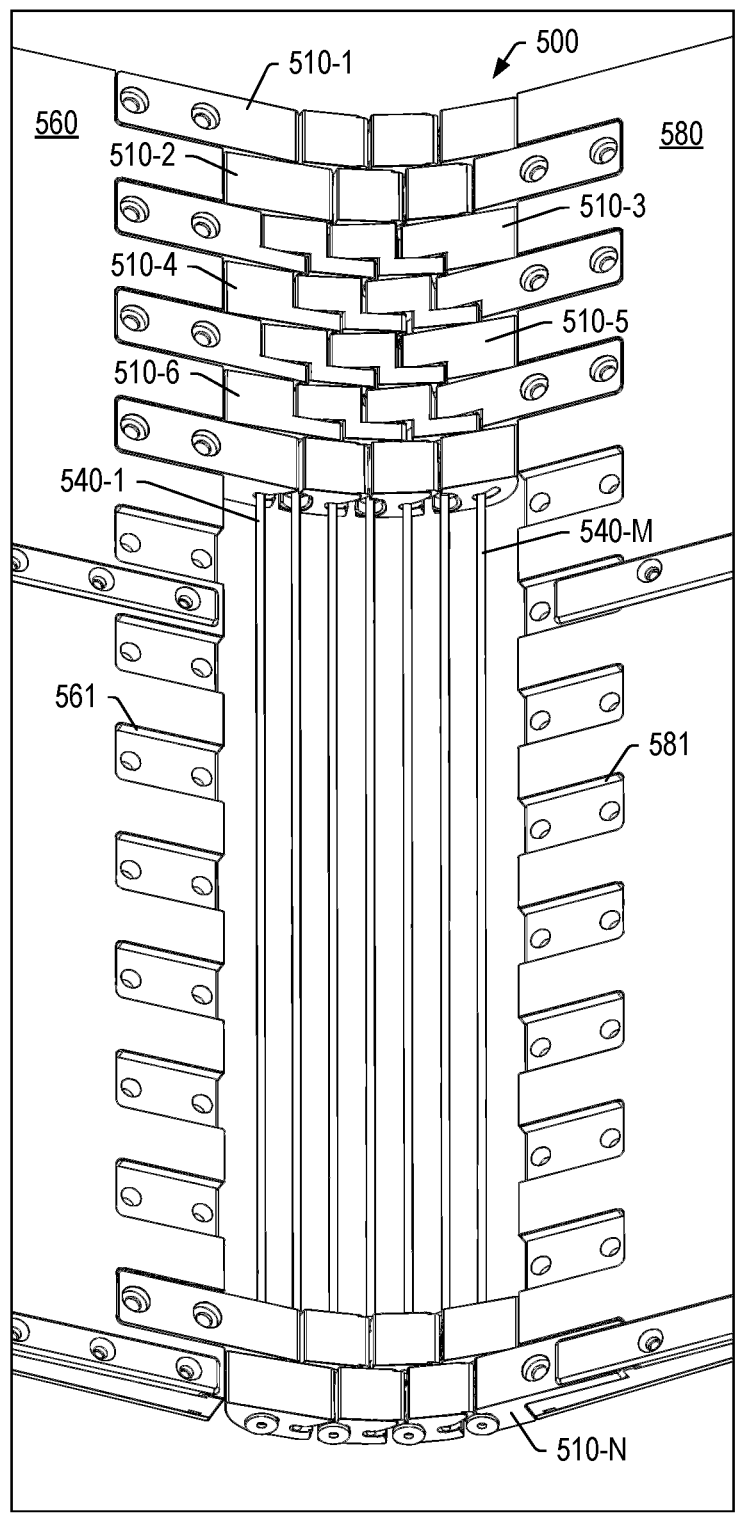
FIG. 15 is a perspective view of an example of a hinge assembly.

FIG. 15 shows a perspective view of an example of the hinge assembly 500, which may be suitable for use as the hinge assembly 500 or the hinge assembly 700 of the device 100. As an example, the device 100 may include multiple instances of the hinge assembly 500, including, for example, a side-by-side arrangement where each instance can provide a range from approximately 0 degrees to approximately 180 degrees such that a total range is provided from approximately 0 degrees to approximately 360 degrees.

In FIG. 15, the hinge assembly 500 is shown as operatively coupling panels 560 and 580 (e.g., consider portions of a foldable display housing, etc.). In FIG. 15, various components and/or features can be present in multiples. As shown, the panels 560 and 580 can include recesses 561 and 581, respectively, to receive links of link assemblies 510-1 to 510-N. As shown, the hinge assembly 500 can include rods 540-1 to 540-M, which are received by the link assemblies 510-1 to 510-N. In the example of FIG. 15, the number of link assemblies is twenty-four (e.g., N=24) and the number of rods is seven (e.g., M=7), noting that another number of link assemblies and/or another number of rods may be utilized. As an example, the rods 540-1 to 540-M may be axles that collectively define a radius of curvature. For example, a radius of curvature may be defined by centers of the seven rods of the example of FIG. 15.

In the example of FIG. 15, some of the link assemblies may be active link assemblies and some of the link assemblies may be dummy link assemblies. For example, an active link assembly can dictate movement while a dummy link assembly may be a spacer, act as a guide, etc. For example, in FIG. 15, the link assemblies 510-1 and 510-2 can be dummy link assemblies while the next four link assemblies 510-3, 510-4, 510-5 and 510-6 can be active link assemblies. As an example, a device can include two active link assemblies, four active link assemblies, 6 active link assemblies, etc. As an example, active link assemblies can be in pairs where one pair may be proximate to one side of a device and another pair may be proximate to another, opposing side of the device. In the example of FIG. 15, the hinge assembly may include eight active link assemblies (e.g., four proximate to one side and four proximate to another, opposing side). As an example, rods may extend from one side to another side or may be shorter. For example, consider one set of rods for one set of link assemblies and another set of rods for another set of link assemblies.

As an example, rods can include ends that may be threaded for coupling to bolts or other component such that rod tension can be adjustable where a higher tension may act to clamp various components of the hinge assembly 500 in a manner that provides a desired amount of friction. For example, where washers are disposed between adjacent link assemblies, an increase in tension may provide for an increase in friction against surfaces of the washers. As an example, tension may be adjustable for purposes of ergonomics such that tension is tailored to user experience where a device can be positioned by a hand or hands of a user while being able to maintain the desired position without creeping movement, etc., which may be due to the influence of gravity. As an example, the hinge assembly 500 may be characterized using one or more torques. In such an example, a gravity torque may be overcome through use of friction and/or one or more other techniques (e.g., mechanical stops, magnets for magnetic forces, etc.).

As to curvature, it can be defined as a value that measures how curved is a curve at a point on the curve. At any point P on a curve there is a circle of right size that touches P and fits the most (e.g., most-fitting circle an osculating circle). The flatter the curve at P, the larger is its osculating circle; whereas, the sharper the curve at P, the smaller is its osculating circle. The value of curvature can be defined as $1/r$, where r is the radius of the osculating circle. When the osculating circle is large, the curve is flattish, and the curvature $1/r$ is small.

As an example, one or more hinge assemblies may be structured with respect to a continuous, bendable display. As explained, utilization of multiple hinge assemblies to achieve a range from approximately 0 degrees to approximately 360 degrees may provide for reducing stresses (e.g., compressive stresses and/or tensile stresses) of a continuous, bendable display, which may be, for example, a laminated structure (e.g., stacks of layers, etc.). As an example, a device such as the device 100 can include a display housing that includes multiple instances of a hinge assembly such as the hinge assembly 500. In such an example, a pair of hinge assemblies can be disposed toward one side of an intermediate portion of a display housing where one of the pair open a wing portion of the display housing to 180 degrees and the other of the pair provides for an additional 180 degrees, for example, from 180 degrees to 360 degrees. As an example, a pair of hinge assemblies may be adjacent where maximum stress from each hinge assembly as experienced by a display panel is offset (e.g., consider offset by at least 0.2 cm or more (e.g., consider an offset of approximately 0.5 cm or 1 cm or more).

Figure 16A:
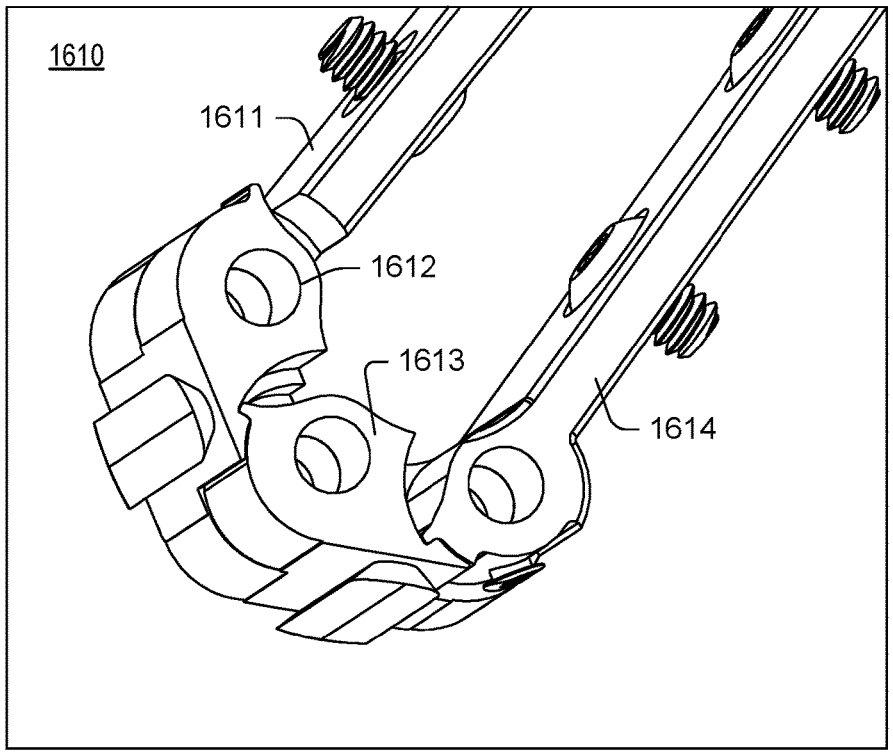
FIG. 16A, FIG. 16B and FIG. 16C show examples of hinge assemblies.
Figure 16B:
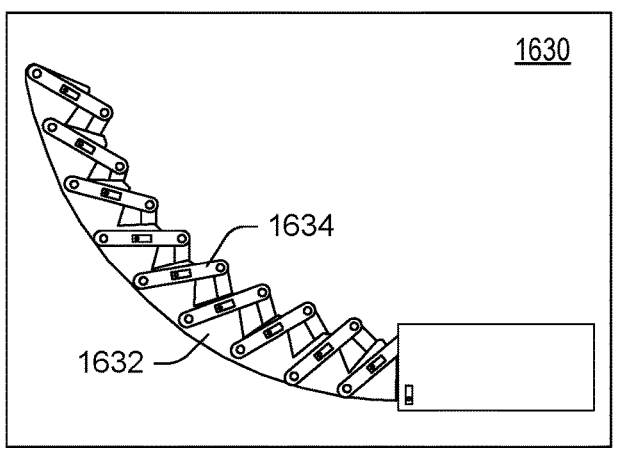
Figure 16C:
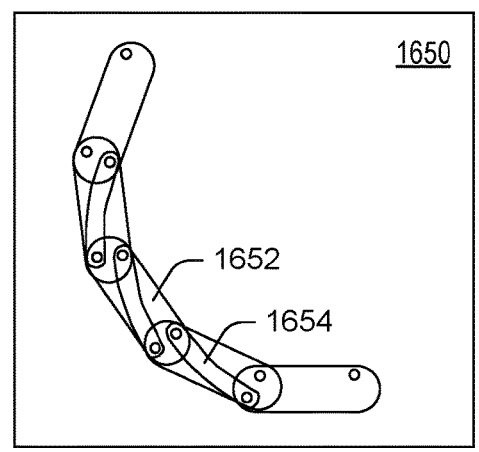

FIG. 16A, FIG. 16B and FIG. 16C show various examples of hinge assemblies 1610, 1630 and 1650, which may be utilized in a device such as the device 100, etc. For example, the foldable display housing 400 can include one or more of the hinge assemblies 1610, 1630 and 1650.

As shown, the hinge assembly 1610 includes links 1611, 1612, 1613 and 1614 where the links 1611 and 1614 are end links. The hinge assembly 1610 can be characterized by a radius of curvature.

As shown, the hinge assembly 1630 can include a flexible back bone 1632 that supports a scissoring assembly 1634.

As shown, the hinge assembly 1650 can include main links 1652 and guide links 1654 where the guide links 1654 control movement of the main links 1652.

As an example, a hinge assembly can provide a shape that is suitable for a bendable display when the hinge assembly is in a closed orientation.

As an example, a bendable display can be a flexible OLED technology display where a substrate can be polymeric such as, for example, polyimide. As an example, an overall thickness of a film stack of layers including OLEDs can be of the order of several millimeters or less. For example, consider layers such as a thin-film transitory (TFT) layer on a foldable substrate; an insulating layer covering the TFT; an OLED on the insulating layer; an encapsulation layer on the substrate; a flexible touch screen panel bonded to the encapsulation layer; and a hard coat cover window film that maintains the optical properties of a display film while providing some resistant to scratches, abrasions and impacts.

As an example, when bending a stack of layered films, there can be a location in the stack that may be a neutral axis, or neutral bending plane, where there can be effectively zero strain. As an example, a bendable display can include a display module that is located at or near the neutral plane to help reduce strains and stresses experienced by the display module. Where a layered bendable display is utilized, too much compressive stress on an inward bend can result in buckling and delamination, while excessive tensile stress can result in cracking and delamination. While each element in the display stack can bend to relatively tight radii (e.g., consider less than approximately 15 mm) as an independent thin film, when elements are bonded together with adhesion and then bent, mechanical stress can be transferred between the bonded elements, which may increase risk of delamination, buckling, etc., because of tensile force and/or compressive force present in the stack.

Referring to FIGS. 16A, 16B and 16C, various features may be utilized to define paths and curvatures. In the example hinge assembly 1610, various contact surfaces are shown that can define minimum and/or maximum positions. In the example hinge assembly 1630, stacked, asymmetric scissors can bend along a flexible backbone as they extend where such an approach may be tuned to different curvatures and where asymmetry can provide for bias of a neutral bending curve. In the example hinge assembly 1650, the guide links 1654 between non-adjacent main links 1652 can communicate relative motion of one pair of the main links 1652 to the next.

As an example, a display housing can include a front side, a back side and a display panel on the front side that spans an intermediate portion and wing portions of the display housing, where the wing portions fold over the front side of the intermediate portion, where the wing portions open to form a continuous front facing viewable display, and where the wing portions open and fold over the back side of the intermediate portion and meet to form a substantially continuous back facing viewable display. Such a display housing can be utilized, for example, as part of a notebook computer (e.g., clamshell computer) where the display housing provides a display area that is greater than a footprint of a base housing such as a keyboard housing. In such an example, a user may have adequate display space without having to resort to use of a separate, additional display. For example, as a notebook computer can be a mobile device, when a user is traveling for work or wants to move from one work desk to another, a display housing that includes wings that can fold and unfold can provide for adequate display space without the user having to carry along a separate, additional display. Further, a separate, additional display demands connectivity for receipt of a display signal (e.g., display data), which means that a user may also have to carry along a cable suitable for transmitting a display signal (e.g., HDMI, USB-C, DP, etc.).

As shown in various examples, wings of a display housing of a notebook computer can open to form a single continuous widescreen that can extend beyond the sides of a base housing and the wings can be further foldable to allow a user to set them at a desired angle beyond 180 degrees, for example, to 360 degrees to form a substantially continuous viewable display that may be controlled in an independent manner or a coordinated manner with respect to a continuous viewable display of an opposing side of the display housing. In various examples, a substantially continuous viewable display can differ from a continuous viewable display due to presence of a joint or juncture, which may be formed by ends of a flexible display panel.

As an example, a notebook computer can include a widescreen display with an intermediate portion with wing portions where the wing portions are approximately 360 degree foldable. In such an example, the intermediate portion can be of an area approximately the same as a base housing, such as, for example, a keyboard housing. However, as explained, in a fully open position (e.g., 360 degree open), the intermediate portion may be of an area that is smaller than that of a base housing. For example, where multiple hinge assemblies are utilized on each side (e.g., for each wing portion) with spaced apart axes such that a sum of the multiple hinge assemblies can provide a range from approximately 0 degrees to approximately 360 degrees. As to approximately 0 degrees for a closed position of a display housing, as explained with respect to various examples of FIG. 10, a range may be from approximately −20 degrees (e.g., consider inward angling of a wing portion or wing portions) to approximately +20 degrees (e.g., consider overlapping with some amount of outward angling of a wing portion or wing portions). As to approximately 360 degrees for an open position of a display housing, a range may be determined based on a range of degrees for a closed position of a display housing. For example, if a wing portion is angled inwardly at approximately 10 degrees (e.g., −10 degrees), then an open position may be approximately 370 degrees. As explained, approximately 360 degree for an open position can correspond to wing portions where ends meet to form a substantially continuous viewable display where the wing portions are in a common plane.

As explained, a display housing can be coupled to a base housing by one or more hinge assemblies. As an example, a hinge assembly or hinge assemblies can be coupled to a display housing within bounds of an intermediate portion of a flexible display panel supported by the display housing. Where a single central hinge assembly with a turntable is utilized, the display housing may be rotatable using the turntable such that a substantially continuous viewable display can be facing forward or facing backward. For example, consider the example scenario of FIG. 4 where the display housing 400 may be rotated such that either the user 101-1 or the user 101-2 is viewing the substantially continuous viewable display formed by wing portions of the display housing 400.

Referring to the example of FIG. 4, as an example, one or more hinge assemblies of a display housing may provide for angling wing portions. For example, consider a hinge assembly or hinge assemblies that can form a conically shape such that radii of curvature are larger closer to a base housing and smaller away from the base housing. In such an approach, a front facing viewable display and a back facing viewable display of a display housing may be antiparallel. Such an approach can provide for viewing angles other than complementary angles as shown in the example of FIG. 4. For example, in the example of FIG. 4, the display housing 400 is shown as being approximately 90 degrees with respect to the base housing 200 and with respect to the desktop 103. Such an angle may be suitable where the users 101-1 and 101-2 can adjust seating height, height of the desktop 103, etc. For example, the users 101-1 and 101-2 may be seated on adjustable height chairs and/or the desktop 103 can be an adjustable height desktop. As an example, the device 100 as shown in the example of FIG. 4 may be utilized in a conference room on a conference table. In such an example, the device 100 may be positioned in the middle of the conference table where individuals seated on either side of the conference table can see the continuous viewable display or the substantially continuous viewable display of the device 100.

As an example, a device can include a combination of one or more horizontal hinge assemblies to connect a display housing with base a base housing (e.g., to allow tilting a display housing to a desired angle) and one or more vertical hinge assemblies that allow wing portions of the display housing to be folded to a desired angle, for example, from a closed position (e.g., 0 degrees), passing an open planar position (e.g., 180 degrees) to an open folded position (e.g., 360 degrees).

As explained, a device can include circuitry that can control rendering of content to a display where the display includes an intermediate portion and wing portions. Such a device may provide for simultaneous multiple multimedia views for videos, games, pages, etc., which may help to reduce demand for reordering GUIs (e.g., shifting to front, shifting back, etc.). Such a device can effectively provide for a doubled display area and for multiple opposite facing display areas, which, in either instance, can reduce demand for video and/or USB-C ports as may be required for separate, additional displays.

As an example, a user may utilize a device with a foldable display housing for one or more of a variety of tasks. For example, consider media streaming or game play tasks in widescreen mode, business application tasks (presenting slides/sheets or pitching in a meeting while viewing/interacting with the participants), etc. As an example, a user may dedicate wing portion side space for communication tools (e.g., chats, screen sharing programs, etc.), one or more additional instances of a game, programming/prototyping, CAD/CAE/CAM design, audio mastering, stock market follow-up, etc.

As explained, a device with a foldable display housing can provide for folding of wing portions of the foldable display housing to form viewable displays or a viewable display for people sitting to sides of an intermediate portion of the foldable display housing or behind the intermediate portion. For example, consider an interviewee and interviewer scenario where an interviewer may utilize the device to present information to the interviewee.

As an example, in a kiosk or store environment, a device with a foldable display housing may be configured such that a continuous viewable display may be formed that can provide advertisements, interactive features, etc., optionally to multiple users. For example, consider a display housing that includes touch circuitry such that touch sensing can be performed for one or more touches from one or more users. A display housing that is folded to provide a continuous display viewable from multiple sides may attract more consumers and, for example, graphics, images, etc., may be presented that can transition from one side to another and/or that provide a three-dimensional presentation of an object such that it appears more realistic than in a rendering to a two-dimensional display.

As an example, a device can include a display housing with a display panel that includes an intermediate portion and two wing portions. In such an example, the display housing can be connected to a base housing along at least a portion of a length of the intermediate portion, for example, consider a hinge assembly that provides for closed and open clamshell transitions of the display housing with respect to the base housing. As explained, hinge assemblies can be provided that allow for opening of the wing portions in a range to 180 degrees and beyond 180 degrees (e.g., to 360 degrees).

As explained, a notebook computer can be set with its upper lid open and foldable sides extending from an intermediate portion to form a relatively continuous planar viewable display, which can be considered to be a widescreen display. As explained, a user may fold foldable sides partially either inwards or outwards to set them independently to a desired angle (e.g., between 0 degrees and 360 degrees with respect to the intermediate portion). For example, a user could show the most outer parts of a display (either left or right) to a second person standing in front of him/her (e.g., behind the intermediate portion) by turning each of the foldable sides by a 360 degree angle with respect to the intermediate portion.

In a closed configuration, foldable sides (e.g., wing portions) can be folded over an intermediate portion, which may then be folded over a base housing (e.g., a keyboard housing, etc.), for example, to a closed clamshell position. In such an example, the notebook computer can occupy about the same space in a horizontal plane while being a bit thicker in a vertical direction (see, e.g., FIG. 14 with 3 stacked layers versus 2 layers for a device without a foldable display housing that includes foldable wings adjacent to respective sides of an intermediate portion).

As an example, a device can include a processor; memory accessible to the processor; a base housing; a display housing that includes a front side, a back side and a display panel on the front side that spans an intermediate portion and wing portions of the display housing, where the wing portions fold over the front side of the intermediate portion, where the wing portions open to form a continuous front facing viewable display, and where the wing portions open and fold over the back side of the intermediate portion and meet to form a substantially continuous back facing viewable display; and a hinge assembly that couples the display housing to the base housing. In such an example, the wing portions can be equal in length or can be unequal in length.

As an example, a display housing can include wing portions that include a first wing portion and a second wing portion where a sum of a length of the first wing portion and a length of the second wing portion exceeds a length of an intermediate portion of the display housing.

As an example, a display housing can include an intermediate portion and wing portions include a first wing portion and a second wing portion where the display housing includes a first hinge assembly that couples the intermediate portion and the first wing portion and a second hinge assembly that couples the intermediate portion and the second wing portion. In such an example, the first hinge assembly can be operable over a range of angles of approximately 0 degrees to approximately 360 degrees and the second hinge assembly can be operable over a range of angles of approximately 0 degrees to approximately 360 degrees.

As an example, a device can include a display housing where a first wing portion and a second wing portion are of equal length where, for example, a sum of the lengths of the first and second wing portions exceeds a length of an intermediate portion of the display housing.

As an example, a device can include a display housing where a first wing portion and a second wing portion are of unequal length where, for example, a sum of the lengths of the first and second wing portions exceeds a length of the intermediate portion.

As an example, a device can include a display housing with wing portions that include a first wing portion and a second wing portion where the display housing includes a first set of hinge assemblies that couples an intermediate portion of the display housing and the first wing portion and a second set of hinge assemblies that couples the intermediate portion and the second wing portion. In such an example, each of the first set and the second set of hinge assemblies may provide a maximum open angle for each of the respective first and second wing portions of approximately 360 degrees to form a substantially continuous back facing viewable display of the device.

As an example, a first set of hinge assemblies of a display housing can include two 180 degree hinge assemblies and a second set of hinge assemblies of the display housing can include two 180 degree hinge assemblies. In such an example, the display housing can include wing portions disposed adjacent to opposing sides of an intermediate portion where the wing portions can open in a range from approximately 0 degrees to approximately 180 degrees to greater than 180 degrees, for example, to 360 degrees.

As an example, a device can include a base housing that includes a base housing length where a substantially continuous back facing viewable display of a foldable display housing the device that is hingedly coupled to the base housing has a length that is less than the base housing length.

As an example, a base housing of a device can have a base housing length where a substantially continuous back facing viewable display of a foldable display housing of the device has a length that is equal to the base housing length.

As an example, a device can include circuitry that renders content to a display panel of a display housing according to a display scheme responsive to folding of wing portions of the display housing. In such an example, the display scheme can be for a front facing viewable display and a back facing viewable display scheme. In such an example, the circuitry renders common content to a front facing viewable display of the display panel and to the substantially continuous back facing viewable display.

As an example, a device can include a foldable display housing that can be folded to provide a substantially continuous back facing viewable display that includes a junction formed by wing portions of the foldable display housing where the foldable display housing includes an intermediate portion that can provide a continuous front facing viewable display.

As an example, a device can include an auxiliary housing deployable from a back side of a display housing where, for example, the auxiliary housing includes a touch input surface. For example, consider a touchpad surface, a touch-type keyboard surface, etc. As an example, a touch-type keyboard surface may include depressible keys. As an example, an auxiliary housing may be deployable via a recess in a back side of a display housing, via overcoming a magnetic attraction force with a back side of a display housing, etc.

As an example, a device can include a hinge assembly that couples a display housing to a base housing where the hinge assembly includes a turntable. In such an example, the display housing can be folded to provide a substantially continuous back facing viewable display that includes a junction formed by wing portions of the display housing where the display housing includes an intermediate portion that can provide a continuous front facing viewable display where, for example, via the turntable of the hinge assembly, the front facing viewable display can be spun to be back facing (e.g., rear facing) and the back facing viewable display to be front facing. In such an example, the viewable displays can be spun to be side facing (e.g., one facing left and the other facing right).

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 17:
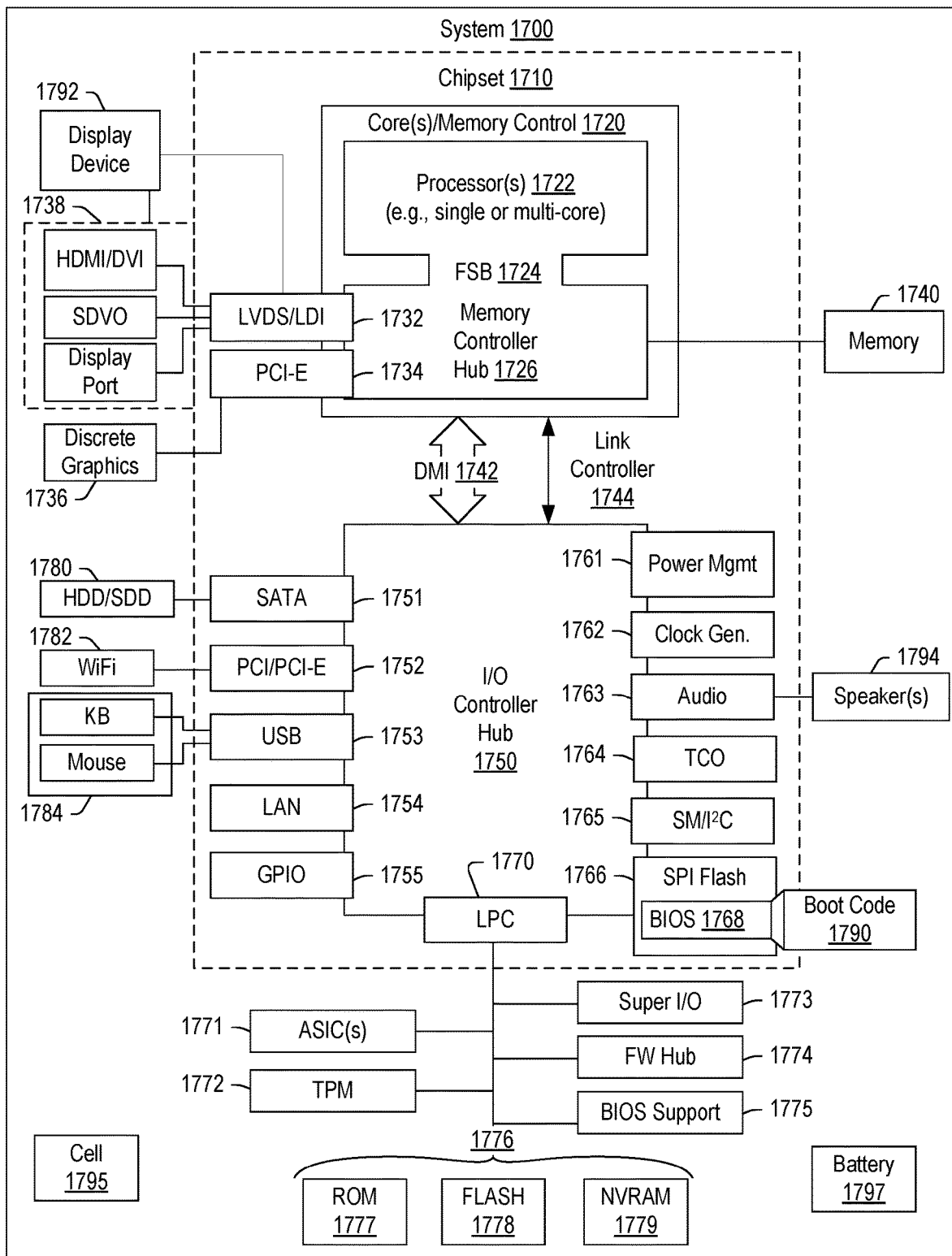
FIG. 17 is a diagram of an example of a system.

While various examples of circuits or circuitry have been discussed, FIG. 17 depicts a block diagram of an illustrative computer system 1700. The system 1700 may be or be part of a computing device or computing system, such as one of the THINKCENTRE® or THINKPAD® series of personal computers sold by Lenovo (US) Inc. of Morrisville, NC, or a workstation computer, such as the THINKSTATION®, as sold by Lenovo (US) Inc. of Morrisville, NC; however, as apparent from the description herein, a display device, a folding device, or other machine may include other features or only some of the features of the system 1700.

As an example, a monitor or display device may include features such as one or more of the features included in one of the LENOVO® IDEACENTRE® or THINKCENTRE® "all-in-one" (AIO) computing devices (e.g., sold by Lenovo (US) Inc. of Morrisville, NC). For example, the LENOVO®

IDEACENTRE® A720 computing device includes an Intel® Core i7 processor, a 27 inch frameless multi-touch display (e.g., for HD resolution of 1920×1080 or more), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner.

As shown in FIG. 17, the system 1700 includes a so-called chipset 1710. A chipset refers to a group of integrated circuits, or chips, that are designed to work together. Chipsets are usually marketed as a single product (e.g., consider chipsets marketed under the brands INTEL®, AMD®, etc.).

In the example of FIG. 17, the chipset 1710 has a particular architecture, which may vary to some extent depending on brand or manufacturer. The architecture of the chipset 1710 includes a core and memory control group 1720 and an I/O controller hub 1750 that exchange information (e.g., data, signals, commands, etc.) via, for example, a direct management interface or direct media interface (DMI) 1742 or a link controller 1744. In the example of FIG. 17, the DMI 1742 is a chip-to-chip interface (sometimes referred to as being a link between a "northbridge" and a "southbridge").

The core and memory control group 1720 include one or more processors 1722 (e.g., single core or multi-core) and a memory controller hub 1726 that exchange information via a front side bus (FSB) 1724. As described herein, various components of the core and memory control group 1720 may be integrated onto a single processor die, for example, to make a chip that supplants the conventional "northbridge" style architecture.

The memory controller hub 1726 interfaces with memory 1740. For example, the memory controller hub 1726 may provide support for DDR SDRAM memory (e.g., DDR, DDR2, DDR3, etc.). In general, the memory 1740 is a type of random-access memory (RAM). It is often referred to as "system memory".

The memory controller hub 1726 further includes a low-voltage differential signaling interface (LVDS) 1732. The LVDS 1732 may be a so-called LVDS Display Interface (LDI) for support of a display device 1792 (e.g., a CRT, a flat panel, a projector, etc.). A block 1738 includes some examples of technologies that may be supported via the LVDS interface 1732 (e.g., serial digital video, HDMI/DVI, display port). The memory controller hub 1726 also includes one or more PCI-express interfaces (PCI-E) 1734, for example, for support of discrete graphics 1736. Discrete graphics using a PCI-E interface has become an alternative approach to an accelerated graphics port (AGP). For example, the memory controller hub 1726 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1750 includes a variety of interfaces. The example of FIG. 17 includes a SATA interface 1751, one or more PCI-E interfaces 1752 (optionally one or more legacy PCI interfaces), one or more USB interfaces 1753, a LAN interface 1754 (more generally a network interface), a general purpose I/O interface (GPIO) 1755, a low-pin count (LPC) interface 1770, a power management interface 1761, a clock generator interface 1762, an audio interface 1763 (e.g., for speakers 1794), a total cost of operation (TCO) interface 1764, a system management bus interface (e.g., a multi-master serial computer bus interface) 1765, and a serial peripheral flash memory/controller interface (SPI Flash) 1766, which, in the example of FIG. 17, includes BIOS 1768 and boot code 1790. With respect to network connections, the I/O hub controller 1750 may include integrated gigabit Ethernet controller lines multiplexed with a PCI-E interface port. Other network features may operate independent of a PCI-E interface.

The interfaces of the I/O hub controller 1750 provide for communication with various devices, networks, etc. For example, the SATA interface 1751 provides for reading, writing or reading and writing information on one or more drives 1780 such as HDDs, SDDs or a combination thereof. The I/O hub controller 1750 may also include an advanced host controller interface (AHCI) to support one or more drives 1780. The PCI-E interface 1752 allows for wireless connections 1782 to devices, networks, etc. The USB interface 1753 provides for input devices 1784 such as keyboards (KB), one or more optical sensors, mice and various other devices (e.g., microphones, cameras, phones, storage, media players, etc.). On or more other types of sensors may optionally rely on the USB interface 1753 or another interface (e.g., I2C, etc.). As to microphones, the system 1700 of FIG. 17 may include hardware (e.g., audio card) appropriately configured for receipt of sound (e.g., user voice, ambient sound, music, other audio, etc.). As an example, the system 1700 can include an audio processor, which may be part of an audio card or may be integrated circuitry with one or more other components of the system 1700.

In the example of FIG. 17, the LPC interface 1770 provides for use of one or more ASICs 1771, a trusted platform module (TPM) 1772, a super I/O 1773, a firmware hub 1774, BIOS support 1775 as well as various types of memory 1776 such as ROM 1777, Flash 1778, and non-volatile RAM (NVRAM) 1779. With respect to the TPM 1772, this module may be in the form of a chip that can be used to authenticate software and hardware devices. For example, a TPM may be capable of performing platform authentication and may be used to verify that a system seeking access is the expected system.

The system 1700, upon power on, may be configured to execute boot code 1790 for the BIOS 1768, as stored within the SPI Flash 1766, and thereafter processes data under the control of one or more operating systems and application software (e.g., stored in system memory 1740). An operating system may be stored in any of a variety of locations and accessed, for example, according to instructions of the BIOS 1768. Again, as described herein, a satellite, a base, a server or other machine may include fewer or more features than shown in the system 1700 of FIG. 17. Further, the system 1700 of FIG. 17 is shown as optionally include cell phone circuitry 1795, which may include GSM, CDMA, etc., types of circuitry configured for coordinated operation with one or more of the other features of the system 1700.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A device comprising:
   a processor;
   memory accessible to the processor;

a base housing;

a display housing that comprises a front side, a back side and a display panel on the front side that spans an intermediate portion and wing portions of the display housing, wherein the wing portions fold over the front side of the intermediate portion, wherein the wing portions open to form a continuous front facing viewable display, and wherein the wing portions open and fold over the back side of the intermediate portion and meet, end-to-end, to form a substantially continuous back facing viewable display; and a hinge assembly that couples the display housing to the base housing.

2. The device of claim 1, wherein the wing portions are equal in length.

3. The device of claim 1, wherein the wing portions are unequal in length.

4. The device of claim 1, wherein the wing portions comprise a first wing portion and a second wing portion and wherein a sum of a length of the first wing portion and a length of the second wing portion exceeds a length of the intermediate portion.

5. The device of claim 1, wherein the wing portions comprise a first wing portion and a second wing portion and wherein the display housing comprises a first hinge assembly that couples the intermediate portion and the first wing portion and a second hinge assembly that couples the intermediate portion and the second wing portion.

6. The device of claim 5, wherein the first hinge assembly comprises a range of angles of approximately 0 degrees to approximately 360 degrees and wherein the second hinge assembly comprises a range of angles of approximately 0 degrees to approximately 360 degrees.

7. The device of claim 5, wherein the first wing portion and the second wing portion are of equal length.

8. The device of claim 7, wherein a sum of the lengths of the first and second wing portions exceeds a length of the intermediate portion.

9. The device of claim 5, wherein the first wing portion and the second wing portion are of unequal length.

10. The device of claim 9, wherein a sum of the lengths of the first and second wing portions exceeds a length of the intermediate portion.

11. The device of claim 1, wherein the wing portions comprise a first wing portion and a second wing portion and wherein the display housing comprises a first set of hinge assemblies that couples the intermediate portion and the first wing portion and a second set of hinge assemblies that couples the intermediate portion and the second wing portion.

12. The device of claim 11, wherein each of the first set and the second set of hinge assemblies provides a maximum open angle for each of the respective first and second wing portions of approximately 360 degrees to form the substantially continuous back facing viewable display.

13. The device of claim 11, wherein the first set of hinge assemblies comprises two 180 degree hinge assemblies and wherein the second set of hinge assemblies comprises two 180 degree hinge assemblies.

14. The device of claim 1, wherein the base housing comprises a base housing length and wherein the substantially continuous back facing viewable display comprises a length that is less than the base housing length.

15. The device of claim 1, wherein the base housing comprises a base housing length and wherein the substantially continuous back facing viewable display comprises a length that is equal to the base housing length.

16. The device of claim 1, comprising circuitry that renders content to the display panel according to a display scheme responsive to folding of the wing portions, wherein the display scheme comprises a front facing viewable display and a back facing viewable display scheme.

17. The device of claim 16, wherein the circuitry renders common content to a front facing viewable display of the display panel and to the substantially continuous back facing viewable display.

18. The device of claim 1, wherein the substantially continuous back facing viewable display comprises a junction formed by the wing portions.

19. The device of claim 1, comprising an auxiliary housing deployable from the back side of the display housing, wherein the auxiliary housing comprises a touch input surface.

20. The device of claim 1, wherein the hinge assembly that couples the display housing to the base housing comprises a turntable.

* * * * *